(12) United States Patent
Ootsuka

(10) Patent No.: US 10,454,201 B2
(45) Date of Patent: Oct. 22, 2019

(54) NAMEPLATE MOUNTING STRUCTURE

(71) Applicant: FANUC CORPORATION, Yamanashi (JP)

(72) Inventor: Yuuma Ootsuka, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 35 days.

(21) Appl. No.: 15/686,376

(22) Filed: Aug. 25, 2017

(65) Prior Publication Data
US 2018/0062301 A1    Mar. 1, 2018

(30) Foreign Application Priority Data

Aug. 26, 2016   (JP) .................. 2016-166150

(51) Int. Cl.
| H01R 13/46 | (2006.01) |
| G09F 7/10 | (2006.01) |
| F16B 2/22 | (2006.01) |
| H05K 5/02 | (2006.01) |
| G09F 3/06 | (2006.01) |
| G09F 7/02 | (2006.01) |
| G09F 7/18 | (2006.01) |

(52) U.S. Cl.
CPC ............. *H01R 13/465* (2013.01); *F16B 2/22* (2013.01); *G09F 3/06* (2013.01); *G09F 7/02* (2013.01); *G09F 7/10* (2013.01); *H05K 5/0252* (2013.01); *G09F 2007/1869* (2013.01)

(58) Field of Classification Search
CPC . H01R 13/465; F16B 2/22; G09F 3/06; G09F 7/02; G09F 7/10; G09F 2007/1869; H05K 5/0252

See application file for complete search history.

(56) References Cited

U.S. PATENT DOCUMENTS

| 4,101,884 | A | * | 7/1978 | Benton, Jr. ............... G09F 7/04 340/815.75 |
| 4,884,353 | A | | 12/1989 | Taylor |
| 5,034,731 | A | * | 7/1991 | Rundsztuk ............... G09F 3/06 340/635 |
| D825,472 | S | * | 8/2018 | Yamanaka .................. D13/147 |
| 2006/0040546 | A1 | * | 2/2006 | Werthman ............. H01R 11/11 439/488 |

FOREIGN PATENT DOCUMENTS

| CN | 103295469 A | 9/2013 |
| CN | 203982695 U | 12/2014 |
| CN | 204178638 U | 2/2015 |
| CN | 204759922 U | 11/2015 |
| CN | 105894966 A | 8/2016 |
| DE | 102008058871 B3 | 6/2010 |
| JP | S53-146395 U | 11/1978 |
| JP | S57-45676 U | 3/1982 |
| JP | S61-99871 U | 6/1986 |
| JP | H1-155084 U | 10/1989 |

(Continued)

*Primary Examiner* — Anita M King
(74) *Attorney, Agent, or Firm* — Hauptman Ham, LLP

(57) ABSTRACT

A mounting section on which a nameplate is mounted includes a space formed between the nameplate and a bottom part of the mounting section, the space enabling the nameplate to be rotated about a fulcrum E that serves as a center of rotation, in a state with the nameplate being mounted on a casing.

7 Claims, 25 Drawing Sheets

(56) References Cited

FOREIGN PATENT DOCUMENTS

| | | | |
|---|---|---|---|
| JP | H2-242285 | A | 9/1990 |
| JP | H08339164 | A | 12/1996 |
| JP | H10-214030 | A | 8/1998 |
| JP | 2001290430 | A | 10/2001 |
| JP | 2005-84221 | A | 3/2005 |

* cited by examiner

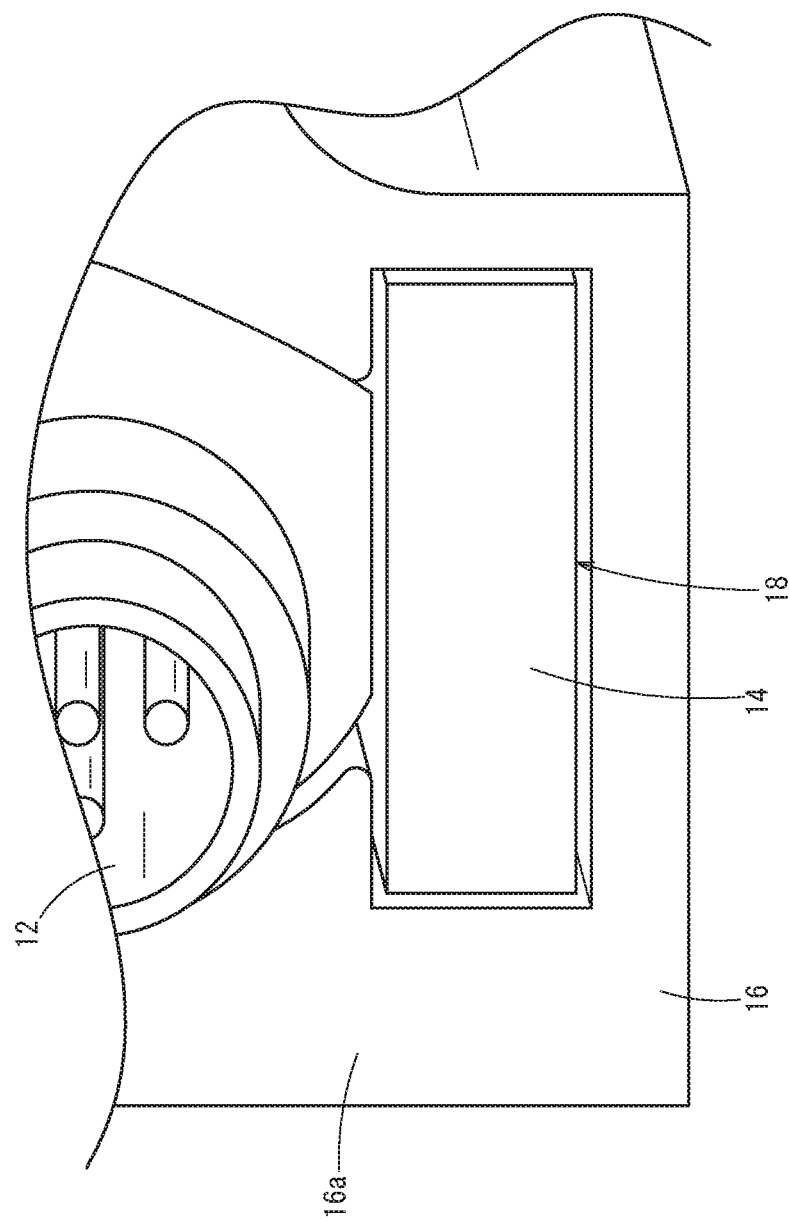

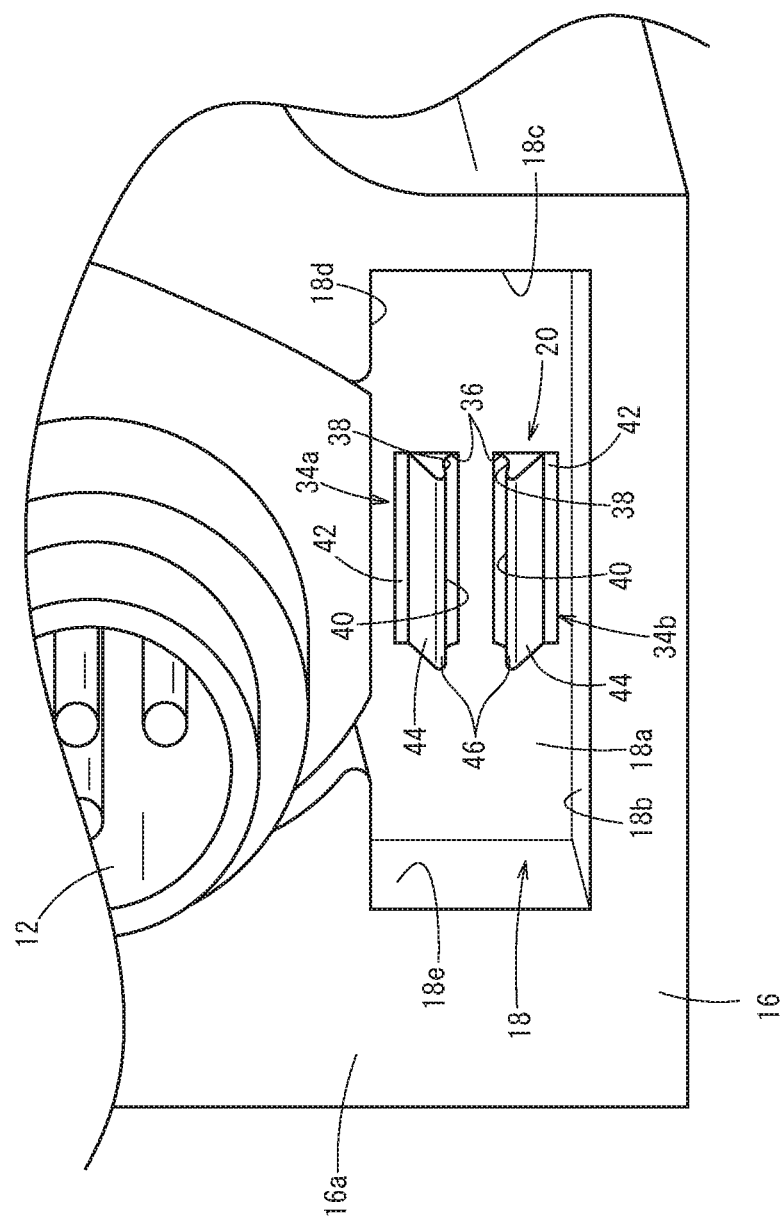

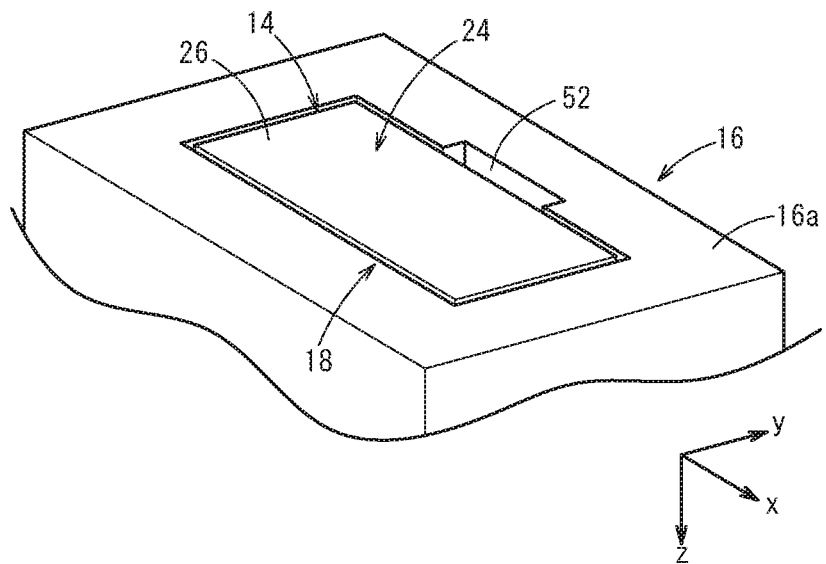
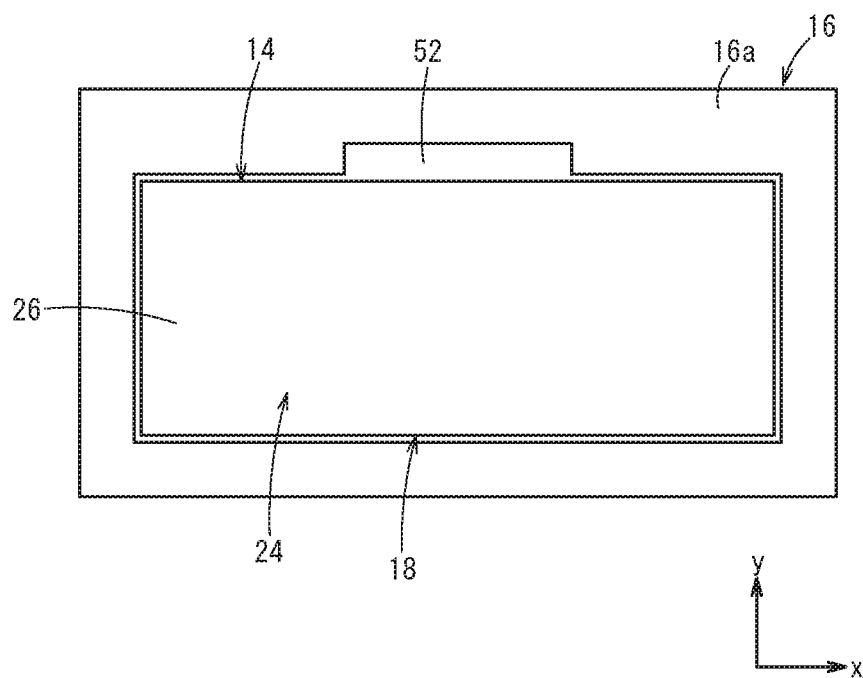

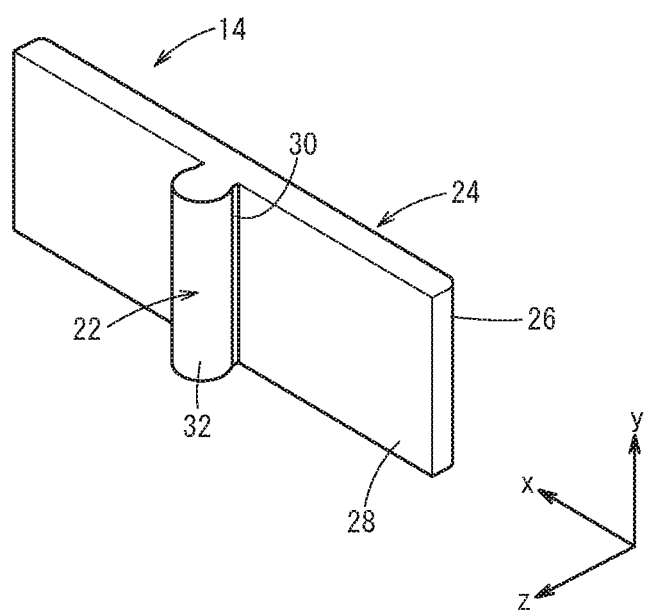

NAMEPLATE MOUNTING STRUCTURE

CROSS-REFERENCE TO RELATED APPLICATION

This application is based upon and claims the benefit of priority from Japanese Patent Application No. 2016-166150 filed on Aug. 26, 2016, the contents of which are incorporated herein by reference.

BACKGROUND OF THE INVENTION

Field of the Invention

The present invention relates to a mounting structure for a nameplate for detachably mounting a nameplate on a casing.

Description of the Related Art

On an electronic device such as an input/output unit having a plurality of connectors, nameplates that indicate names of the connectors are provided in the vicinity of the connectors of a casing of the electronic device, so that an operator can identify the names of the connectors. Since the names of the connectors vary depending on the type of product, it is desirable for the nameplates to be easily attached and detached. The following techniques have been developed as mounting structures for mounting nameplates on a casing.

In Japanese Laid-Open Patent Publication No. 08-339164, a technique is disclosed for mounting a nameplate of a television receiver on a bezel. According to this technique, latching projections that protrude on a rear surface of the nameplate are implanted integrally therein, and latching holes for latching engagement with the protrusions of the nameplate are formed on the bezel. The latching holes of the bezel are formed to be slightly smaller in diameter than the shaft diameters of the projections of the nameplate. The nameplate is fitted to the bezel by inserting the projections of the nameplate into the latching holes of the bezel.

In Japanese Laid-Open Patent Publication No. 2001-290430, a technique is disclosed for mounting a nameplate on a frame such as a box or the like. According to this technique, the nameplate is mounted by being fitted into a groove formed in the frame. When detaching the nameplate from the frame, the nameplate is slid upwardly and a bottom part of the nameplate is removed from the groove, while in addition, a rear surface of the nameplate is placed in abutment against an inclined surface of the frame to thereby raise the nameplate.

SUMMARY OF THE INVENTION

However, ordinarily, there is no need to remove the nameplate of the television receiver from the bezel, and in Japanese Laid-Open Patent Publication No. 08-339164, no method is disclosed for removing the nameplate from the bezel. When removing the nameplate from the bezel, it is considered that a tool or the like would be required. In the case of the technique disclosed in Japanese Laid-Open Patent Publication No. 2001-290430, it is necessary to ensure a space for enabling the nameplate to be slid upwardly. With a small scale electronic device, the space in which the nameplate can be attached is limited, and thus there is a concern that a space for enabling sliding of the nameplate cannot be ensured. Further, with such a small scale electronic apparatus, since the nameplate itself is also formed to be small in size, it is difficult to provide a mechanism on the nameplate itself for detaching the nameplate from the casing.

The present invention has been devised in order to solve the aforementioned problems, and has the object of providing a nameplate mounting structure that enables a nameplate to be easily removed from a casing without the use of a tool or requiring sliding of the nameplate.

The present invention is a mounting structure for a nameplate and by which the nameplate is mounted detachably on a casing, the nameplate comprising a main body portion formed in a plate-like shape, and a projecting part formed to project out from a surface of the main body portion, and the casing comprising a recessed portion in which the nameplate is mounted, a gripping member formed on a bottom part of the recessed portion, and which grips the projecting part, and a fulcrum member in contact with a portion of the nameplate that faces toward the bottom part side of the recessed portion, and which acts as a fulcrum when the nameplate is rotated, wherein the recessed portion includes a space formed between the nameplate and the bottom part of the recessed portion, the space enabling the nameplate to be rotated about the fulcrum that serves as a center of rotation, in a state with the nameplate being mounted on the casing.

When the nameplate is mounted on the casing, in a state in which the position of the projecting part of the nameplate is aligned with the position of the gripping member of the casing, by pressing down a part of the main body portion of the nameplate that overlaps the gripping member, the projecting part is gripped by the gripping member. On the other hand, when removing the nameplate from the casing, the part of the main body portion of the nameplate that overlaps with a side opposite to, with respect to the fulcrum member, the portion where the projecting part is gripped by the gripping member is pressed downwardly. Consequently, the nameplate is rotated about the fulcrum that serves as a center of rotation, and the projecting part of the nameplate becomes disengaged from the gripping member of the casing. It is possible to easily detach the nameplate from the casing merely by depressing the surface of the main body portion of the nameplate, and thus, ease of operation can be enhanced. Therefore, the nameplate can easily be removed from the casing without using a tool or sliding the nameplate.

In the mounting structure for a nameplate according to the present invention, the fulcrum member may be disposed on the gripping member. In accordance with this feature, it is unnecessary to form another member for providing the fulcrum member, and the structure inside the recessed portion can be simplified. Consequently, the shape of a mold for molding the casing can be simplified, and die removal can be performed easily.

In the mounting structure for a nameplate according to the present invention, an upper surface of the gripping member may contact the main body portion, in a state in which the gripping member grips the projecting part, and a portion of the upper surface of the gripping member may function as the fulcrum. In accordance with this feature, it is possible to prevent the nameplate from becoming inclined with respect to the casing, and the nameplate can be supported in a stable manner.

In the mounting structure for a nameplate according to the present invention, the fulcrum member may be disposed on a support member separately from the gripping member. In accordance with this feature, compared to a case in which the fulcrum member is disposed on the gripping member, the position where the fulcrum member is disposed can be set freely, and the degree of freedom in design of the casing can be increased.

In the mounting structure for a nameplate according to the present invention, an upper surface of the support member may contact the main body portion, in a state in which the gripping member grips the projecting part, and a portion of the upper surface of the support member may function as the fulcrum member. In accordance with this feature, it is possible to prevent the nameplate from becoming inclined with respect to the casing, and the nameplate can be supported in a stable manner.

In the mounting structure for a nameplate according to the present invention, fulcrum members may be formed on both sides sandwiching the gripping member therebetween. Within the surface of the nameplate, it is possible to remove the nameplate from the casing, no matter which region of the surface is pressed on either of both sides of the nameplate sandwiching the gripping member therebetween. Thus, ease of operation can be enhanced when removing the nameplate from the casing.

In the mounting structure for a nameplate according to the present invention, the projecting part may be formed in a substantially cylindrical shape extending in parallel to the surface of the main body portion on which the projecting part is disposed, and mutually opposing surfaces of portions of the gripping member and which sandwich the projecting part therebetween may be formed in substantially arcuate shapes. Since the surfaces of the gripping member can be brought into contact with and along the outer shape of the projecting part, the gripping member is capable of retaining the projecting part in a stable manner. Further, since the surfaces of the gripping member that sandwich the projecting part therebetween face toward each other and are smooth, the projecting part can easily be removed from the gripping member, and the nameplate can easily be detached from the casing.

According to the present invention, the nameplate can easily be removed from the casing without using a tool or sliding the nameplate.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 2 is an enlarged view showing the vicinity of a mounting section of a casing according to the first embodiment;

FIG. 4 is an enlarged view showing the vicinity of a mounting section of a casing according to the first embodiment;

FIG. 8A is a perspective view showing the vicinity of a mounting section of a casing according to a comparative example;

FIG. 8B is a front view showing the vicinity of the mounting section of the casing according to the comparative example;

FIG. 21 is a perspective view of the nameplate according to the other Embodiment 4;

DESCRIPTION OF THE PREFERRED EMBODIMENTS

Preferred embodiments of a mounting structure for a nameplate 14 according to the present invention will be described in detail below with reference to the accompanying drawings.

First Embodiment

[Configuration of Input/Output Device]

Figure 1:
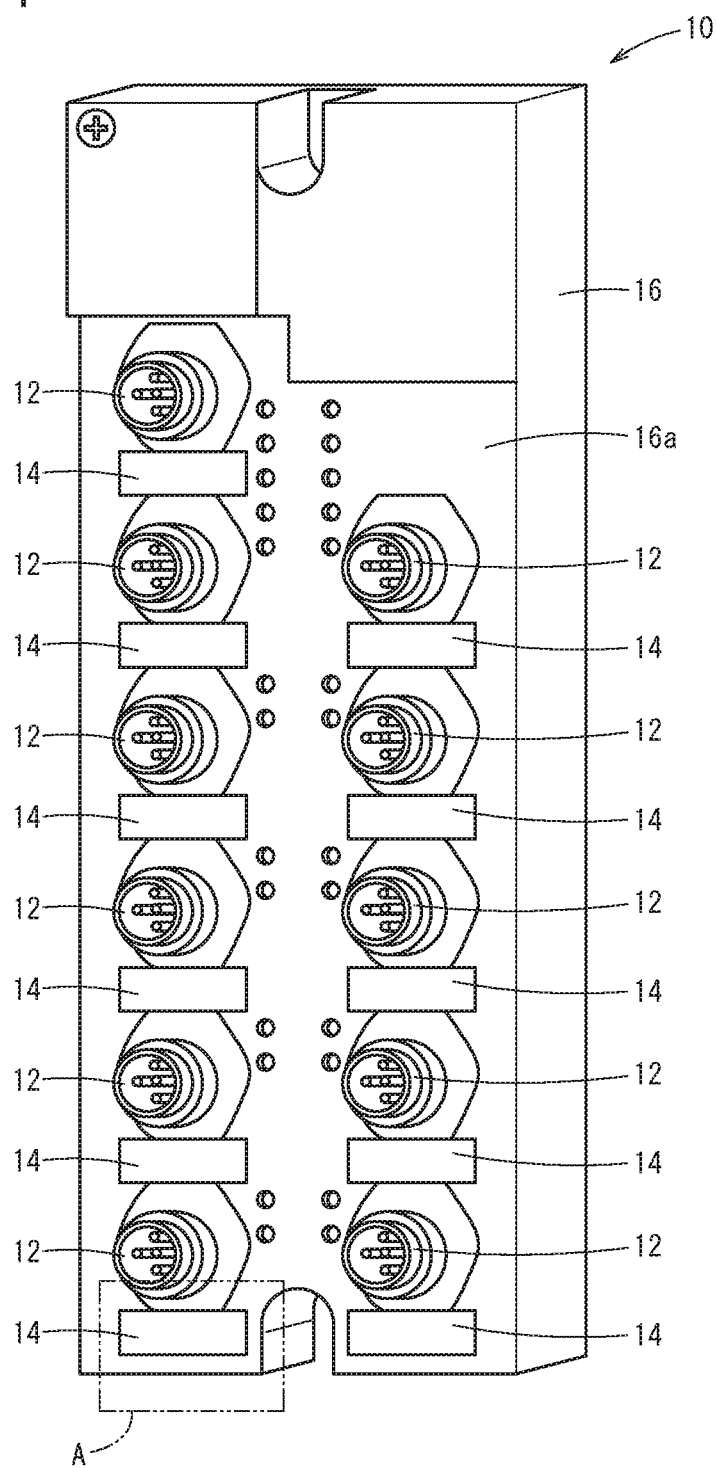
FIG. 1 is a perspective view of an input/output unit of a first embodiment.

FIG. 1 is a perspective view of an input/output unit 10. FIG. 2 is an enlarged view of a portion A indicated by the dotted line in FIG. 1. The input/output unit 10 is an electronic device provided in a control unit having a processor such as a CPU or the like. The input/output unit 10 is accommodated in a casing 16 made of resin. The casing 16 is formed in a substantially rectangular parallelepiped shape. The shape of the majority of the casing 16 is formed by injection molding. The input/output unit 10 includes a plurality of connectors 12 to which there are connected cables for carrying out transmission and reception of signals to and from other control units or peripheral devices and the like. The connectors 12 are exposed to the exterior from a surface 16a of the casing 16. Nameplates 14 made of resin and on which information is noted such as names of each of the connectors 12 are attached to lower portions of the respective connectors 12, when the input/output unit 10 is viewed in the state shown in FIG. 1. The nameplates 14 are formed separately from the casing 16. Mounting sections (recessed portions) 18 (see FIG. 4) for mounting of the nameplates 14 are formed in the casing 16. The mounting sections 18 are formed in concave shapes opening on the surface 16a of the casing 16. The nameplates 14 are capable of being attached to and detached from the mounting sections 18 of the casing 16.

[Configuration of Nameplate]

Figure 3A:
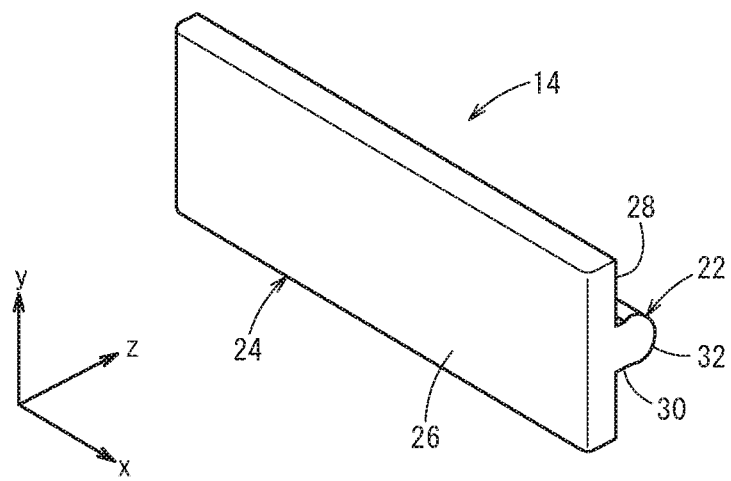
FIG. 3A is a perspective view of a nameplate according to the first embodiment.
Figure 3B:
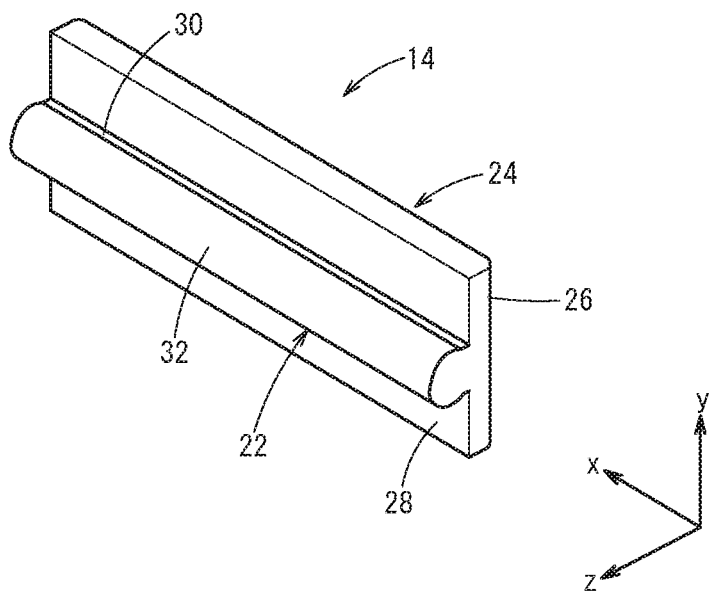
FIG. 3B is another perspective view of the nameplate according to the first embodiment.

FIGS. 3A and 3B are perspective views of the nameplate 14. FIG. 3A is a perspective view of the nameplate 14 showing a surface on which a name or the like of the connector 12 is noted on the nameplate 14. FIG. 3B is a perspective view of the nameplate 14 showing a surface opposite to the surface on which a name or the like of the connector 12 is noted on the nameplate 14. In FIG. 3A, a longitudinal direction of the nameplate 14 is taken to represent an x-axis direction, and the right side defines a side thereof in the positive direction. In FIG. 3A, a transverse direction of the nameplate 14 is taken to represent a y-axis direction, and the upper side defines a side thereof in the positive direction. Further, in FIG. 3A, a direction normal to the surface on which the name or the like of the connector 12 is noted on the nameplate 14 is taken to represent a z-axis direction, and a direction oriented from the surface on the side on which the name or the like of the connector 12 is noted on the nameplate 14 toward the surface opposite to the side on which the name or the like of the connector 12 is noted on the nameplate 14 defines a positive direction.

Hereinafter, the respective coordinate axes will be described in a similar manner in the other drawings as well. In the other drawings, the coordinate axes are described in a coincident manner with the directions and orientations of the respective coordinates, which were defined as described above, at times when the nameplate 14 is mounted on the casing 16.

The nameplate 14 includes a main body portion 24 and a projecting part 22. The main body portion 24 is formed in a plate-like shape. The main body portion 24 includes a front surface 26 on which the name or the like of the connector 12 is noted, and a back surface 28 on the side opposite to the front surface 26. The main body portion 24 is formed with a substantially rectangular shape when the main body portion 24 is viewed from the z-axis direction. A projecting part 22 is formed on the back surface 28 of the main body portion 24. The projecting part 22 is formed to protrude in the z-axis positive direction with respect to the back surface 28. The projecting part 22 is formed to extend in the x-axis direction at a central portion in the y-axis direction of the back surface 28. The projecting part 22 is formed over an entire region from an end in the positive direction to an end in the negative direction in the x-axis direction of the back surface 28.

The projecting part 22 has a connecting portion 30 and a cylindrical portion 32. The cylindrical portion 32 has a substantially cylindrical shape, and a portion thereof on a side surface on the z-axis negative side of the cylindrical portion 32 is formed integrally with the connecting portion 30. Therefore, when the cylindrical portion 32 is viewed from the x-axis direction, a portion thereof on the z-axis negative side of the circle is shaped in the form of a cut out. The connecting portion 30 has a substantially quadrangular prismatic columnar shape. The z-axis negative side surface of the connecting portion 30 is formed integrally with the back surface 28 of the main body portion 24. When the projecting part 22 is viewed from the x-axis direction, a length (width) of the connecting portion 30 in the y-axis direction is formed to be shorter than the diametrical length of the cylindrical portion 32. The center of the connecting portion 30 in the y-axis direction and the center of the cylindrical portion 32 in the y-axis direction are located on the same plane lying parallel to the xz plane.

[Configuration of Mounting Section]

FIG. 4 is an enlarged view of the portion A indicated by the dotted line in FIG. 1, showing a state in which the nameplate 14 is detached from the casing 16.

The mounting section 18 includes a space having a generally rectangular parallelepiped shape, which is formed by a bottom part 18a and respective side surfaces 18b, 18c, 18d, 18e arranged in an upstanding manner from the bottom part 18a. When the casing 16 is viewed from the z-axis direction, an opening of the mounting section 18 is formed in a substantially rectangular shape, which is slightly larger than the surface 26 of the nameplate 14.

A gripping member 20 for supporting the nameplate 14 with respect to the casing 16 is formed in the vicinity of a central portion of the bottom part 18a. The gripping member 20 is made of resin and is molded integrally with the casing 16. The gripping member 20 supports the nameplate 14 with respect to the casing 16 by gripping the projecting part 22 of the nameplate 14. The gripping member 20 is formed to extend in the x-axis direction of the bottom part 18a. The gripping member 20 does not occupy the entire region in the x-axis direction of the bottom part 18a, but rather is formed in a part of the central portion in the x-axis direction.

The gripping member 20 is composed of a pair of claw members 34a, 34b that extend in the z-axis negative direction from the bottom part 18a. The claw member 34a and the claw member 34b are disposed in facing relation to each other sandwiching a straight line that passes through the center of the bottom part 18a in the y-axis direction, and lies parallel to the x-axis direction. Stated otherwise, the pair of claw members 34a, 34b (of the gripping member 20) are disposed on the bottom part 18a so as to be capable of gripping the projecting part 22 when the nameplate 14 is mounted in the mounting section 18 of the casing 16.

The length (height) of the claw members 34a, 34b in the z-axis direction is equal to a length (depth) in the z-axis direction of the mounting section 18 minus a length (thickness) in the z-axis direction of the main body portion 24 of the nameplate 14. When the gripping member 20 is viewed from the x-axis direction, a length in the y-axis direction of the claw members 34a, 34b is formed to gradually decrease from the bottom part 18a to a side thereof in the z-axis negative direction. The surfaces thereof on sides where the claw member 34a and the claw member 34b face one another each have a first leg section 36, a retaining section 38, and a latching section 40 provided in this order from the side of the bottom part 18a toward the side in the z-axis negative direction. Surfaces thereof on opposite sides from the sides where the claw member 34a and the claw member 34b face one another each have a second leg section 42 and a rear surface section 44 provided in this order from the side of the bottom part 18a toward the side in the z-axis negative direction. The claw members 34a, 34b have distal end parts 46 formed at the tip ends thereof on the side in the z-axis negative direction. The distal end parts 46 are formed as upper surfaces (surfaces on a side of the opening of the mounting section 18) of the gripping member 20. The distal end parts 46 are formed as surfaces contiguous with the latching sections 40 and the rear surface sections 44.

When the claw members 34a, 34b are viewed from the x-axis direction, a distance (width) in the y-axis direction between the first leg section 36 and the second leg section 42 is formed to gradually become longer from the z-axis negative direction side toward the z-axis positive direction side. When the claw members 34a, 34b are viewed from the x-axis direction, the first leg sections 36 are formed on a more inward side (toward the side where the claw member 34a and the claw member 34b face each other) than the retaining sections 38. Further, when the claw members 34a, 34b are viewed from the x-axis direction, the second leg sections 42 are formed on a more outward side (toward sides opposite from the side where the claw member 34a and the claw member 34b face each other) than the rear surface sections 44.

When the claw members 34a, 34b are viewed from the x-axis direction, the retaining sections 38 are formed in substantially arcuate shapes shaped convexly on sides opposite to the sides where the claw member 34a and the claw member 34b face each other. The retaining sections 38 abut against the outer circumferential surface of the cylindrical portion 32 of the projecting part 22, in a state in which the gripping member 20 grips the projecting part 22 of the nameplate 14. The diameter formed between the circular arcs of the retaining sections 38 is greater than the diameter of corresponding circular arcs of the outer circumferential surface of the cylindrical portion 32.

When the claw members 34a, 34b are viewed from the x-axis direction, the latching sections 40 are formed in a substantially linear shape extending in the z-axis direction. In a state in which the gripping member 20 is not gripping the projecting part 22 of the nameplate 14, a distance in the y-axis direction between the latching section 40 of the claw member 34a and the latching section 40 of the claw member 34b is formed to be slightly shorter than the length in the y-axis direction of the connecting portion 30, or of substantially the same length as the length in the y-axis direction of the connecting portion 30 of the nameplate 14.

When the claw members 34a, 34b are viewed from the x-axis direction, the rear surface sections 44 are formed so as to widen outwardly (on sides opposite from the sides where the claw member 34a and the claw member 34b face each other) from the z-axis negative direction side toward the z-axis positive direction side.

When the claw members 34a, 34b are viewed from the x-axis direction, the distal end parts 46 thereof are formed in substantially arcuate shapes shaped convexly toward the z-axis negative direction side. Further, when the claw members 34a, 34b are viewed from the x-axis direction, a length thereof from an end on the z-axis positive direction side of the latching section 40 to an end on the z-axis negative direction side of the distal end parts 46 is formed to be slightly shorter than the length in the z-axis direction of the connecting portion 30 of the projecting part 22. Owing thereto, when the gripping member 20 grips the projecting part 22, the latching sections 40 and the distal end parts 46 of the claw members 34a, 34b are fitted in engagement between the back surface 28 of the main body portion 24 and the cylindrical portion 32 of the projecting part 22. Further, in a state in which the gripping member 20 grips the projecting part 22, the back surface 28 of the main body portion 24 and the distal end parts 46 are placed in abutment. In the first embodiment, the distal end parts 46 correspond to the fulcrum member of the present invention.

[Relationship Between Nameplate and Mounting Section]

Figure 5A:
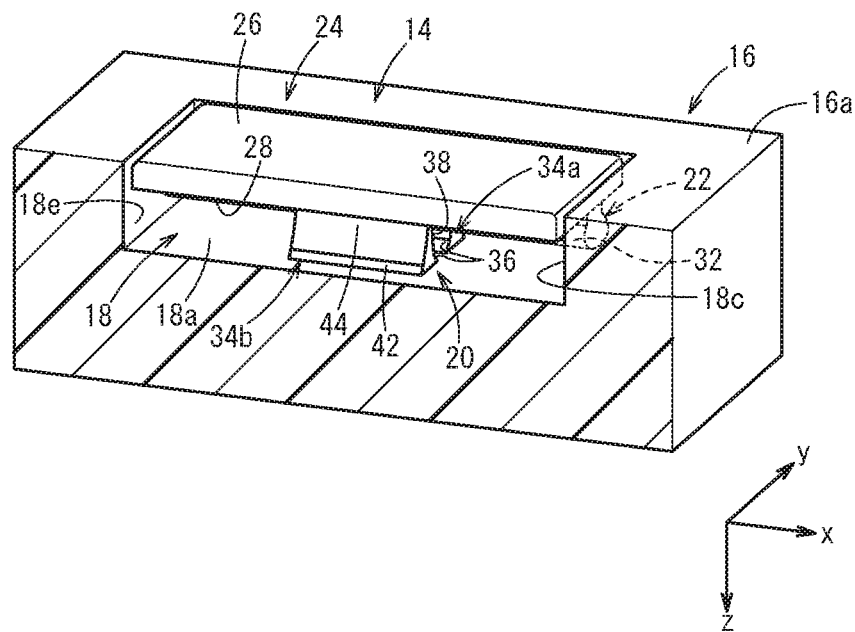
FIG. 5A is a perspective cross-sectional view of a casing in a state in which a nameplate according to the first embodiment is mounted thereon.
Figure 5B:
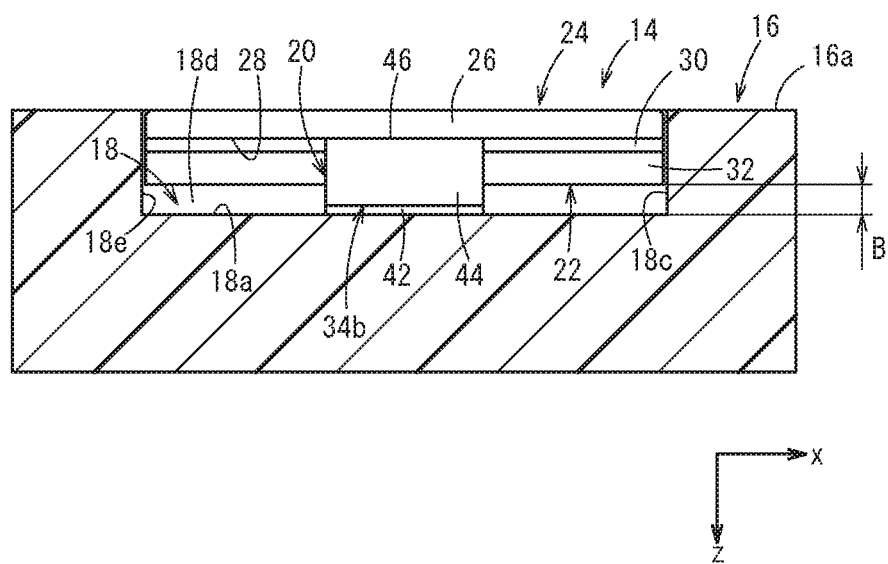
FIG. 5B is a cross-sectional view of the casing in a state in which the nameplate according to the first embodiment is mounted thereon.

FIGS. 5A and 5B are cross-sectional views with the casing 16 cut along a plane parallel to the xz plane, in a state in which the nameplate 14 is mounted on the casing 16. FIG. 5A is a perspective cross-sectional view. FIG. 5B is a cross-sectional view as seen from a side in the y-axis negative direction. The casing 16 is illustrated schematically in FIGS. 5A and 5B.

The back surface 28 of the main body portion 24 abuts against the distal end parts 46 of the gripping member 20. The mounting section 18 includes a gap (space) formed between the projecting part 22 and the bottom part 18a of the mounting section 18. A distance B between the projecting part 22 and the bottom part 18a is set to be longer than the length (thickness) of the main body portion 24 in the z-axis direction. A slight gap is formed between the nameplate 14 and the side surfaces 18b, 18c, 18d, 18e of the mounting section 18.

[Method of Removing the Nameplate]

Figure 6A:
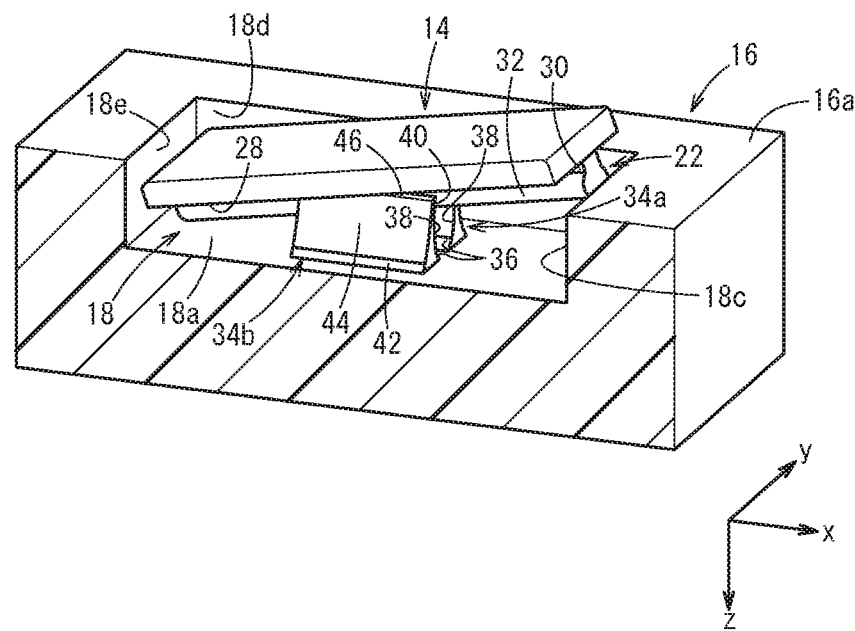
FIG. 6A is a perspective cross-sectional view of a casing showing a state during removal from the casing of a nameplate according to the first embodiment.
Figure 6B:
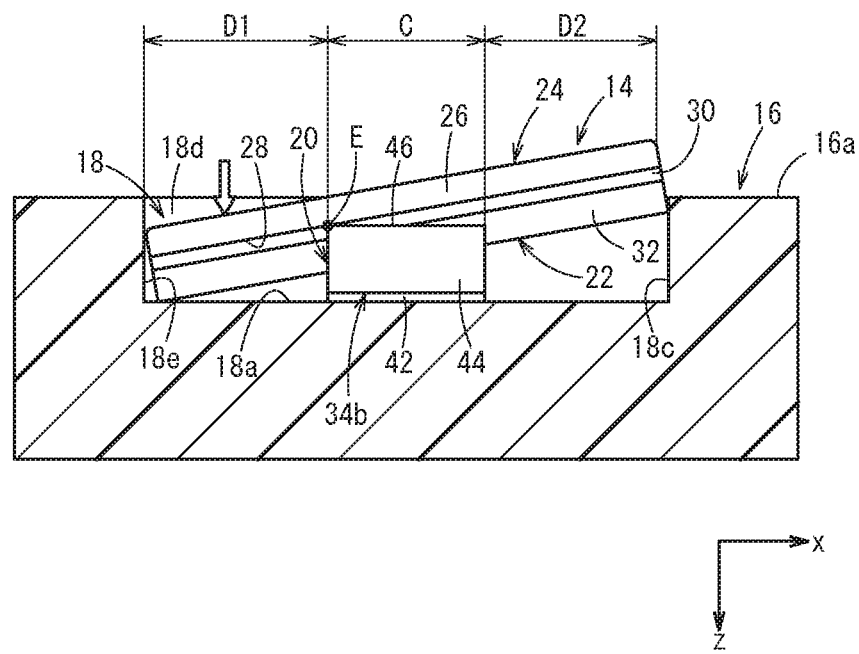
FIG. 6B is a cross-sectional view of the casing showing a state during removal from the casing of the nameplate according to the first embodiment.

FIGS. 6A and 6B are views showing a condition when the nameplate 14 is removed from the casing 16. FIGS. 6A and 6B are cross-sectional views with the casing 16 cut along a plane parallel to the xz plane. FIG. 6A is a perspective cross-sectional view. FIG. 6B is a cross-sectional view as seen from a side in the y-axis negative direction. The casing 16 is illustrated schematically in FIGS. 6A and 6B.

When removing the nameplate 14 from the casing 16, the operator presses the surface 26 of the nameplate 14 in the z-axis positive direction with a fingertip. When the nameplate 14 is viewed from the y-axis direction, the portion to be pressed by the operator is a portion (the regions indicated by D1, D2 in FIG. 6B) within the surface 26 of the nameplate 14, other than the region where the projecting part 22 is gripped by the gripping member 20 (the region indicated by C in FIG. 6B).

For example, it is assumed that the operator has pressed the region D1 of the surface 26, which is more on the x-axis negative direction side than the region C. On the z-axis positive direction side of the region D1, a space exists between the nameplate 14 and the bottom part 18a of the mounting section 18. Further, a slight gap is formed between the nameplate 14 and the side surfaces 18b, 18c, 18d, 18e of the mounting section 18. Therefore, the nameplate 14 is rotated about a portion, which acts as a fulcrum E, of the distal end parts 46 of the claw members 34a, 34b. The fulcrum E is a point on an end in the x-axis negative direction side of the distal end parts 46.

At this time, a force tending to raise the nameplate 14 in the z-axis negative direction acts on the x-axis positive direction side of the nameplate 14. Consequently, a portion of the projecting part 22 on the x-axis positive direction side separates away from the gripping member 20. When the operator presses the nameplate 14 until a state in which the projecting part 22 abuts against the bottom part 18a, a state is brought about in which the x-axis positive direction side of the main body portion 24 rises up from the surface 16a of the casing 16. The operator can now remove the nameplate 14 from the casing 16 by pinching with the fingers the portion of the main body portion 24 that has risen up from the surface 16a, and pulling the nameplate 14 upward.

Moreover, when the operator presses the region D2 of the surface 26, which is more on the x-axis positive direction side than the region C, the fulcrum E is formed on the end in the x-axis positive direction side of the distal end parts 46 of the claw members 34a, 34b. Moreover, the fulcrum E need not necessarily be a point. Since the fulcrum E is a location of contact between the back surface 28 of the nameplate 14 and the distal end parts 46 of the claw members 34a, 34b, in actuality, the fulcrum E may be a line or a plane. Further, the gap formed between the nameplate 14 and the side surfaces 18b, 18c, 18d, 18e of the mounting section 18 may be set to a degree such that, when the nameplate 14 is rotated, the nameplate 14 does not interfere with the side surfaces 18b, 18c, 18d, 18e.

[Method of Mounting the Nameplate]

Figure 7A:
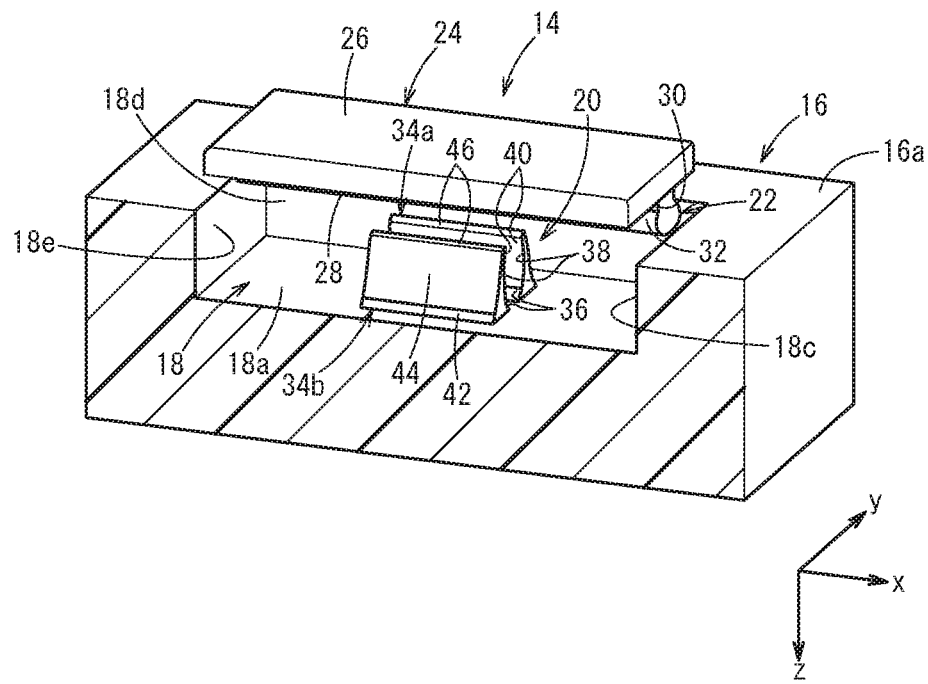
FIG. 7A is a perspective cross-sectional view of a casing showing a state during attachment to the casing of a nameplate according to the first embodiment.
Figure 7B:
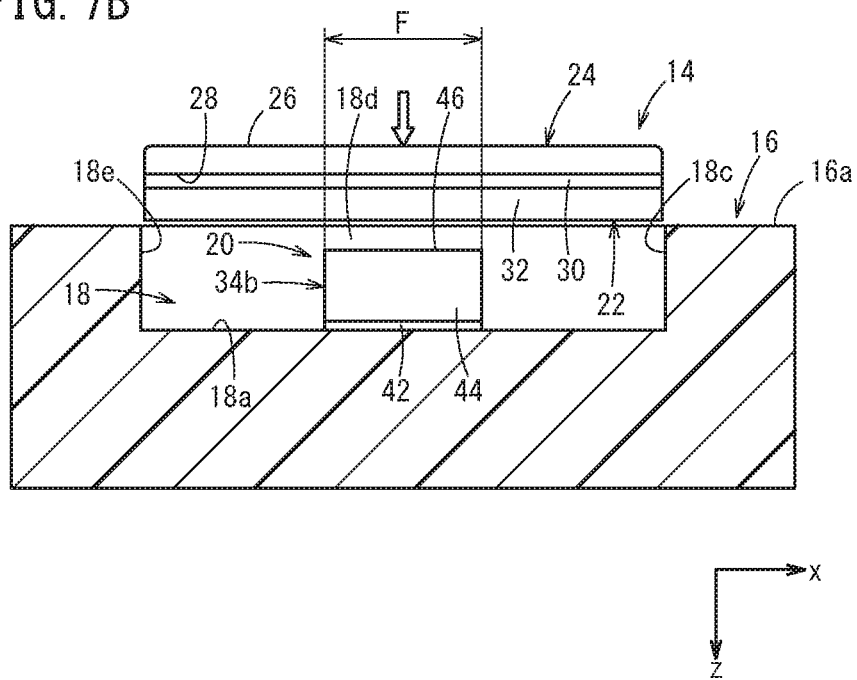
FIG. 7B is a cross-sectional view of the casing showing a state during attachment to the casing of the nameplate according to the first embodiment.

FIGS. 7A and 7B are views showing a condition when the nameplate 14 is mounted on the casing 16. FIGS. 7A and 7B are cross-sectional views with the casing 16 cut along a surface parallel to the xz plane. FIG. 7A is a perspective cross-sectional view. FIG. 7B is a cross-sectional view as seen from a side in the y-axis negative direction. The casing 16 is illustrated schematically in FIGS. 7A and 7B.

When mounting the nameplate 14 on the casing 16, the operator first places the position of the projecting part 22 of the nameplate 14 in the y-axis direction, so as to coincide with the position in the y-axis direction of the gripping member 20, and the nameplate 14 is inserted into the mounting section 18. In a state in which the projecting part 22 is in contact with the distal end parts 46 of the claw members 34a, 34b, the operator presses the surface 26 in the z-axis positive direction with the fingertips. When the nameplate 14 is viewed from the y-axis direction, within the surface 26 of the nameplate 14, the portion that is pressed is a portion where the projecting part 22 is gripped by the gripping member 20 (the region indicated by F in FIG. 7B). At this time, the projecting part 22 pushes the claw members 34a, 34b outwardly. The cylindrical portion 32 passes through the latching sections 40 of the claw members 34a, 34b, and is engaged with the retaining section 38. When the cylindrical portion 32 is engaged with the retaining section 38, the distal end parts 46 abut against the back surface 28 of the main body portion 24. Further, the latching sections 40 and the distal end parts 46 of the claw members 34a, 34b are fitted in engagement between the back surface 28 of the main body portion 24 and the cylindrical portion 32 of the projecting part 22.

[Comparative Example]

Figure 9A:
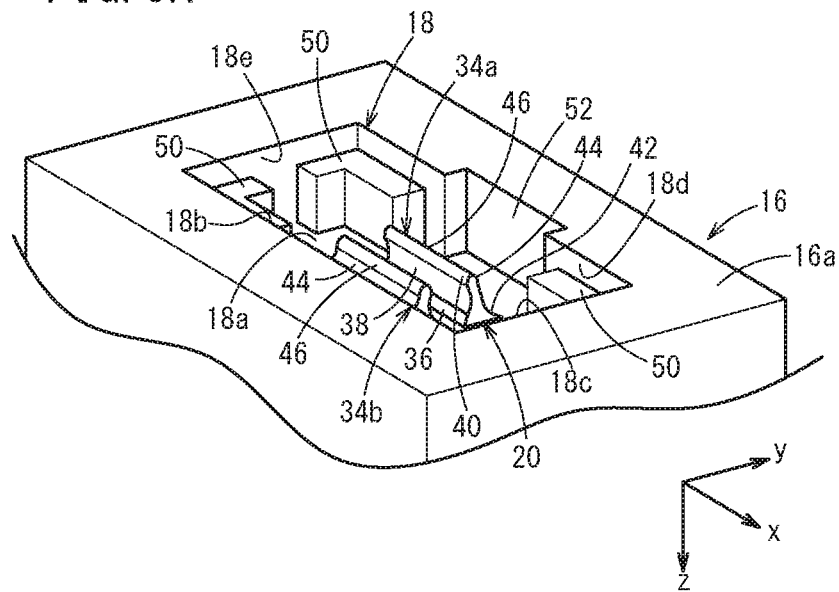
FIG. 9A is a perspective view showing the vicinity of the mounting section of the casing according to the comparative example.
Figure 9B:
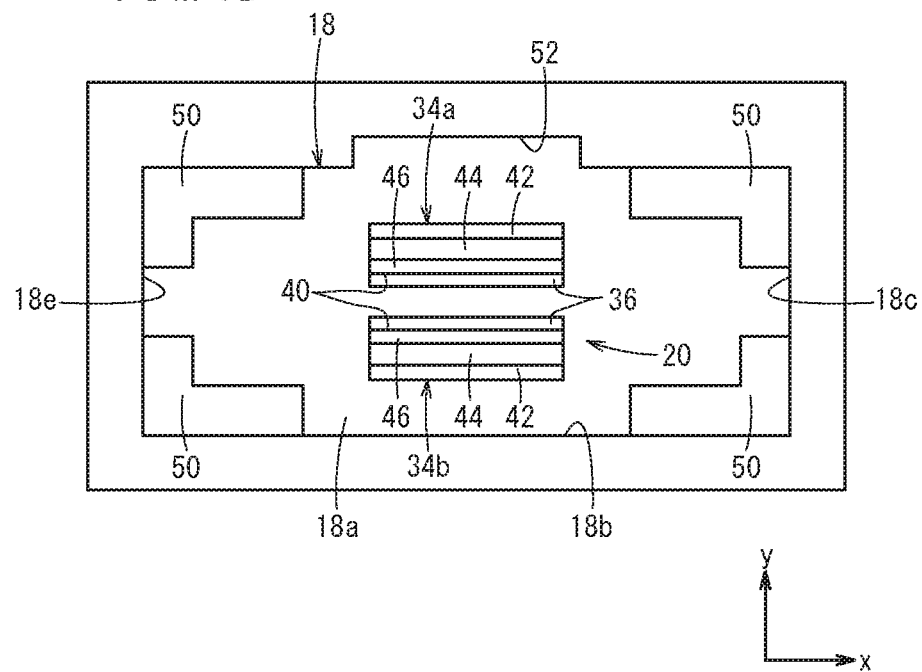
FIG. 9B is a front view showing the vicinity of the mounting section of the casing according to the comparative example.

Next, a mounting structure for a nameplate 14 according to a comparative example will be described. The configuration of the nameplate 14 in the comparative example is the same as that of the nameplate 14 of the above-described first embodiment. The configuration of the mounting section 18 of the casing 16 in the comparative example differs partially from the configuration of the mounting section 18 in the first embodiment. FIGS. 8A and 8B are schematic views showing the vicinity of the mounting section 18 for a nameplate 14 of the casing 16 according to the comparative example. FIG. 8A is a perspective view. FIG. 8B is a view as seen from a side in the z-axis negative direction. FIGS. 9A and 9B are schematic views showing the vicinity of the mounting section 18 for a nameplate 14 of the casing 16 according to the comparative example. FIGS. 9A and 9B show a state in which the nameplate 14 is removed from the condition thereof shown in FIGS. 8A and 8B. FIG. 9A is a perspective view. FIG. 9B is a view as seen from a side in the z-axis negative direction.

In the following, a description will be made concerning aspects in which the configuration of the comparative example differs from the configuration of the first embodiment. Constituent features which are the same as those in the first embodiment are denoted with the same reference numerals, and description of such features is omitted. The comparative example differs from the first embodiment, in that ribs 50 are provided inside the mounting section 18, and an insertion groove 52 is formed on one side surface of the mounting section 18.

The ribs 50 are formed at the four corners of the mounting section 18. When the mounting section 18 is viewed from the z-axis direction, each of the ribs 50 is formed in an L-shape. The length of the ribs 50 in the z-axis direction is equal to a length (depth) in the z-axis direction of the mounting section 18 minus a length (thickness) in the z-axis direction of the main body portion 24 of the nameplate 14. Therefore, when the nameplate 14 is mounted in the mounting section 18, the back surface 28 of the main body portion 24 comes into contact with surfaces on the z-axis negative direction side of the ribs 50.

An insertion groove 52 is formed in a portion of the side surface 18d of the mounting section 18. When the mounting section 18 is viewed from the z-axis direction, the insertion groove 52 is formed to project out in the y-axis positive direction with respect to the side surface 18d. The length (depth) of the insertion groove 52 in the z-axis direction is formed to be substantially the same as the length (depth) of the mounting section 18 in the z-axis direction. The length in the x-axis direction and the length in the y-axis direction of the insertion groove 52 are formed, for example, with a size of a degree that enables the distal end of a flathead screwdriver to be inserted therein.

In the comparative example, when attaching the nameplate 14 to the casing 16, in the same manner as the first embodiment, the operator may press the surface 26 of the nameplate 14 in the positive z-axis direction with his or her fingertip. However, when removing the nameplate 14 from the casing 16, the operator uses a tool such as a flathead screwdriver or the like. The distal end of the tool is inserted into the insertion groove 52, and the tool is rotated about the side surface of the insertion groove 52, with the side surface in the y-axis positive direction acting as a fulcrum. As a result, the projecting part 22 of the nameplate 14 becomes disengaged from the gripping member 20, whereupon the nameplate 14 can be removed from the casing 16.

In the comparative example, when the nameplate 14 is removed from the casing 16, a tool such as a flathead screwdriver or the like is required. In order to easily remove the nameplate 14 from the casing 16, it is desirable for the nameplate 14 to be capable of being detached without using a tool.

In the comparative example, the insertion groove 52 is formed to project in the y-axis positive direction from the side surface 18d of the mounting section 18. When the mounting section 18 is viewed from the z-axis direction, the area of the mounting section 18 is greater than the area of the portion surrounded by the side surfaces 18b, 18c, 18d, 18e of the mounting section 18 by an amount corresponding to the insertion groove 52. In a small electronic device, the area where the nameplate 14 can be mounted is limited, and there is a concern that an area for forming the insertion groove 52 cannot be assured. Further, because the strength of the casing 16 is decreased by providing the insertion groove 52, it is necessary to carry out reinforcement or the like at other locations of the casing 16. Further, there is a concern that providing the insertion groove 52 may impair the external appearance of the casing 16.

[Advantages and Effects]

With the mounting structure for a nameplate 14 according to the first embodiment, the mounting section 18 has the space between the nameplate 14 and the bottom part 18a of the mounting section 18, where the nameplate 14 is able to rotate about the fulcrum E that serves as a center of rotation. Between the nameplate 14 and the bottom part 18a, there is no structure that interferes with the nameplate 14 other than the gripping member 20. Therefore, by the operator pressing on the region D1 or the region D2 of the surface 26 of the nameplate 14, the nameplate 14 can be rotated with the distal end part 46 of the gripping member 20 acting as the fulcrum E (see FIG. 6B). Owing thereto, the projecting part 22 of the nameplate 14, which is gripped by the gripping member 20, separates in part away from the gripping member 20. Among the main body portion 24 of the nameplate 14, a portion thereof on an opposite side from the side on which the operator presses the surface 26 rises up from the surface 16a of the casing 16. The operator can now remove the nameplate 14 from the casing 16 by pinching with the fingers the portion of the main body portion 24 that has risen up from the surface 16a of the casing 16, and pulling the nameplate 14 upward.

When the nameplate 14 is mounted on the casing 16, in a state in which the position of the projecting part 22 of the nameplate 14 is aligned with the position of the gripping member 20, the portion of the region F of the surface 26 of the main body portion 24 of the nameplate 14 is pressed in the z-axis positive direction (see FIG. 7B). As a result, the projecting part 22 is gripped by the gripping member 20, and the nameplate 14 is supported with respect to the casing 16.

Thus, it is possible to easily detach the nameplate 14 from the casing 16 without using a tool, merely by depressing the surface 26 of the main body portion 24 of the nameplate 14, and thus, ease of operation can be enhanced. The distal end part 46 of the gripping member 20, which is a structure that allows the nameplate 14 to be removed from the casing 16, and the space between the nameplate 14 and the bottom part 18a of the mounting section 18 are both provided inside the mounting section 18. Regardless of the presence or absence of the structure for removing the nameplate 14 from the casing 16, the mounting section 18 must be provided as a space in which the nameplate 14 is mounted. Thus, the amount of space inside the casing 16, which is occupied by the structure for removing the nameplate 14 from the casing 16, can be suppressed.

Further, in a state in which the nameplate 14 is mounted on the casing 16, a slight gap is included between the nameplate 14 and the side surfaces 18b, 18c, 18d, 18e of the mounting section 18. The gap may be formed to such a degree that, when the nameplate 14 is removed from the casing 16, the nameplate 14 does not interfere with the side surfaces 18b, 18c, 18d, 18e upon rotation of the nameplate 14. Consequently, the area occupied by the mounting section 18 when viewed from the z-axis direction can be made smaller, for example, in comparison with the case of forming the insertion groove 52 or the like for insertion of a tool, as in the comparative example. Further, it is possible to prevent a decrease in the strength of the casing 16. Further, when the nameplate 14 is mounted on the casing 16, since the main body portion 24 covers substantially the entire area of the opening of the mounting section 18, the external appearance of the casing 16 is not impaired.

Further, in the mounting structure for the nameplate 14 according to the first embodiment, the fulcrum E is provided at the distal end part 46 of the claw members 34a, 34b of the gripping member 20. The gripping member 20 is a structure which is required for mounting the nameplate 14 on the casing 16, and it is a member that already exists in the casing 16. In order to provide the fulcrum E, It is not necessary to form a separate member, and thus the structure of the mounting section 18 can be simplified. Consequently, the shape of a mold for molding the casing 16 can be simplified, and die removal can be performed easily.

Further, in the mounting structure for the nameplate 14 according to the first embodiment, surfaces of the retaining sections 38 of the claw members 34a, 34b of the gripping member 20 are formed in substantially arcuate shapes. Consequently, since the surfaces of the gripping member 20 can be brought into contact with the outer shape of the projecting part 22, the projecting part 22 can be retained by the gripping member 20. Thus, the nameplate 14 can be fixed to the casing 16. Further, since the surfaces of the gripping member 20 that sandwich the projecting part 22 therebetween and face toward each other are smooth, the projecting part 22 can easily be removed from the gripping member 20, and the nameplate 14 can easily be detached from the casing 16.

[Second Embodiment]

Next, a mounting structure for a nameplate 14 according to a second embodiment will be described. In the following, a description will be made concerning aspects in which the configuration of the second embodiment differs from the configuration of the first embodiment. Constituent features which are the same as those in the first embodiment are denoted with the same reference numerals, and description of such features is omitted. The configuration of the nameplate 14 in the second embodiment is the same as that of the nameplate 14 of the first embodiment. The second embodiment differs from the first embodiment, in that a support member 54 is newly formed on the bottom part 18a of the mounting section 18.

[Configuration of Mounting Section]

Figure 10A:
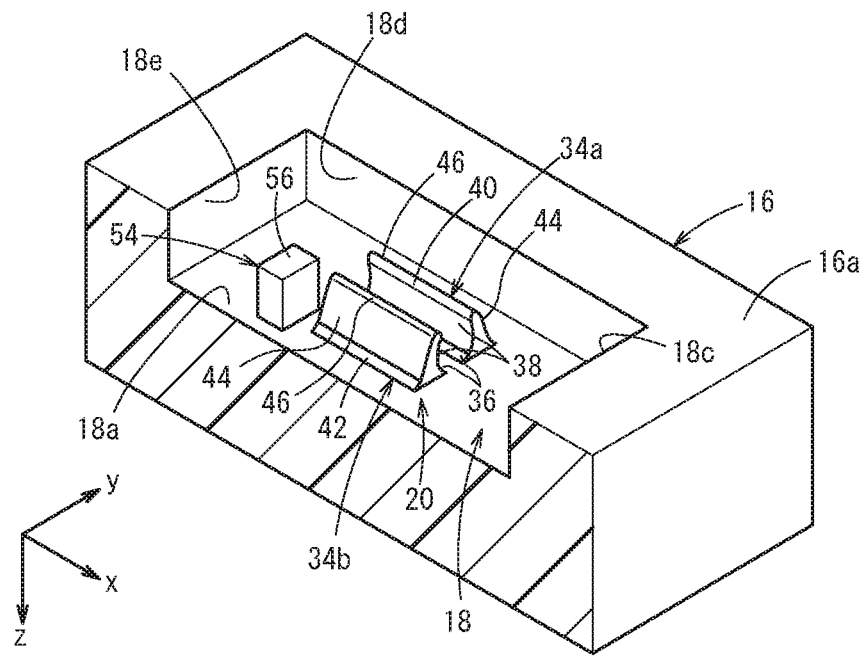
FIG. 10A is a perspective cross-sectional view of a casing in a state in which a nameplate according to a second embodiment is removed therefrom.
Figure 10B:
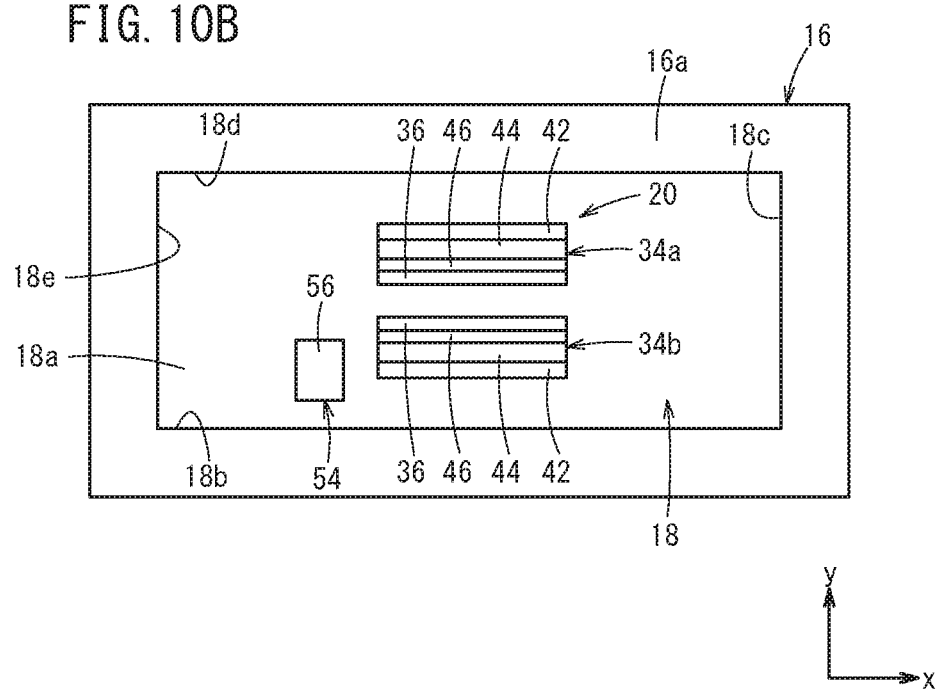
FIG. 10B is a cross-sectional view of the casing in a state in which the nameplate according to the second embodiment is removed therefrom.

FIGS. 10A and 10B are views showing the vicinity of the mounting section 18. FIGS. 10A and 10B show a state in which the nameplate 14 has been removed from the casing 16. FIG. 10A is a perspective cross-sectional view with the casing 16 cut along a surface parallel to the xz plane.

FIG. 10B is a view in which the mounting section 18 is seen from a side in the z-axis negative direction. The casing 16 is illustrated schematically in FIGS. 10A and 10B.

The support member 54 is formed on the bottom part 18a of the mounting section 18. The support member 54 is made of resin and is molded integrally with the casing 16. The support member 54 is formed in a substantially rectangular parallelepiped shape extending from the bottom part 18a toward a side in the z-axis negative direction. The support member 54 has an abutment 56 formed on a side end thereof in the z-axis negative direction. The abutment 56 has a surface substantially parallel to the xy plane. The abutment 56 is formed as an upper surface of the support member 54 (a surface on the side of the opening of the mounting section 18).

The support member 54 is formed on the x-axis negative direction side of the claw member 34b at a certain distance from the claw member 34b. The support member 54 is disposed at a position so as not to interfere with the projecting part 22 of the nameplate 14 when the nameplate 14 is attached to the casing 16.

The length of the support member 54 in the z-axis direction is equal to a length in the z-axis direction of the mounting section 18 minus a length (thickness) in the z-axis direction of the main body portion 24 of the nameplate 14. Consequently, when the nameplate 14 is mounted on the casing 16, the back surface 28 of the main body portion 24 comes into contact with the abutment 56 of the support member 54. In the second embodiment, the abutment 56 corresponds to the fulcrum member of the present invention.

The length of the claw members 34a, 34b in the z-axis direction is formed to be shorter than a length that is obtained by subtracting a length (thickness) in the z-axis direction of the main body portion 24 of the nameplate 14 from a length in the z-axis direction of the mounting section 18. Consequently, when the nameplate 14 is mounted on the casing 16, the back surface 28 of the main body portion 24 does not come into contact with the distal end parts 46 of the claw members 34a, 34b.

[Relationship Between Nameplate and Mounting Section]

Figure 11A:
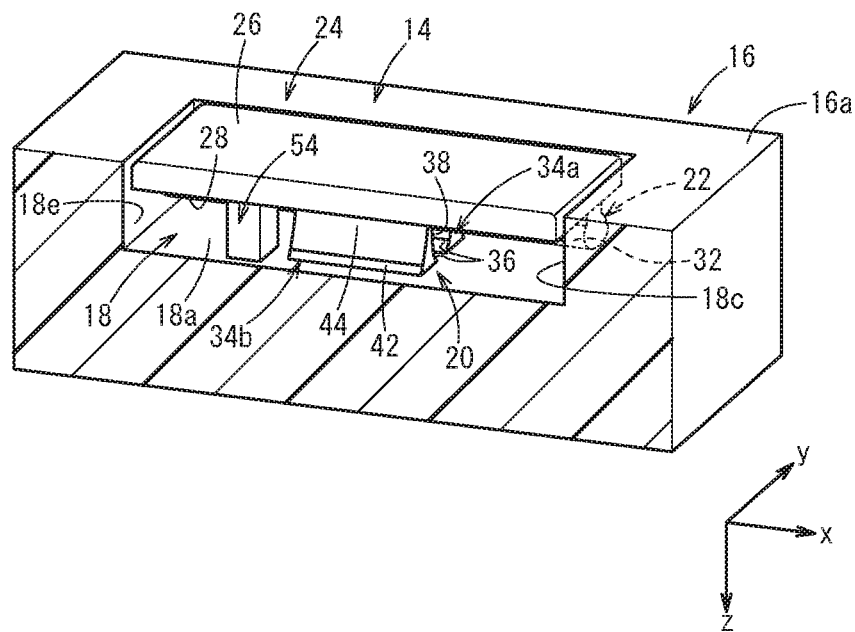
FIG. 11A is a perspective cross-sectional view of the casing in a state in which the nameplate according to the second embodiment is mounted thereon.
Figure 11B:
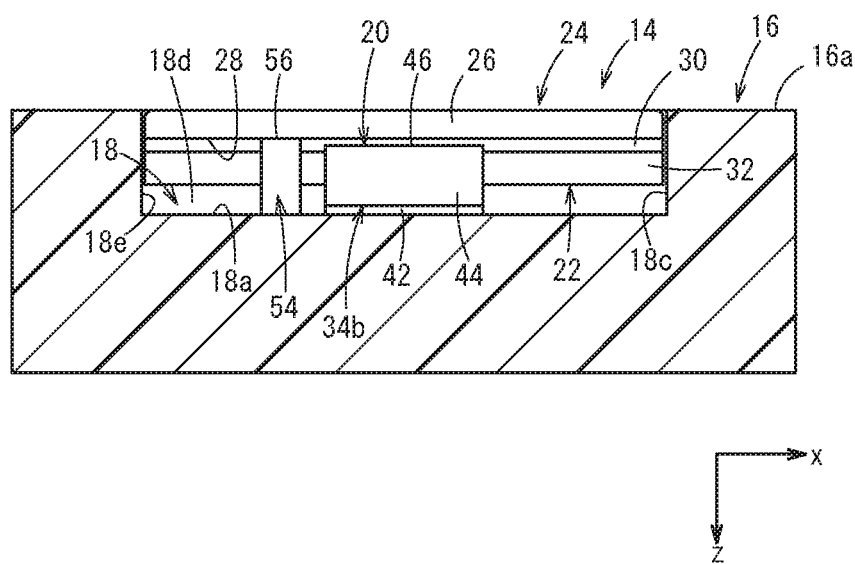
FIG. 11B is a cross-sectional view of the casing in a state in which the nameplate according to the second embodiment is mounted thereon.

FIGS. 11A and 11B are cross-sectional views with the casing 16 cut along a plane parallel to the xz plane, in a state in which the nameplate 14 is mounted on the casing 16. FIG. 11A is a perspective cross-sectional view. FIG. 11B is a cross-sectional view as seen from a side in the y-axis negative direction. The casing 16 is illustrated schematically in FIGS. 11A and 11B. The back surface 28 of the main body portion 24 is separated from the distal end parts 46 of the gripping member 20. On the other hand, the back surface 28 of the main body portion 24 abuts against the abutment 56 of the support member 54.

[Method of Removing the Nameplate]

Figure 12A:
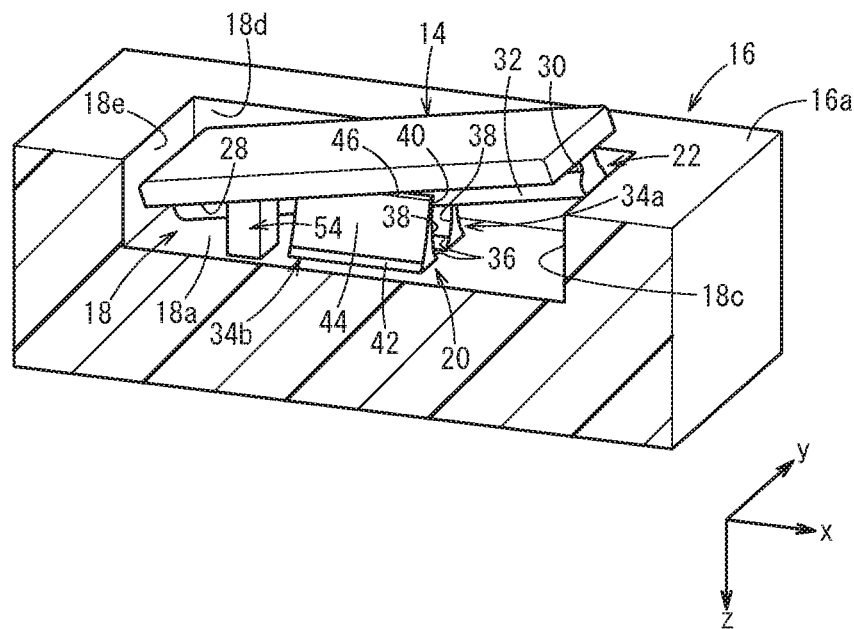
FIG. 12A is a perspective cross-sectional view of the casing showing a state during removal from the casing of the nameplate according to the second embodiment.
Figure 12B:
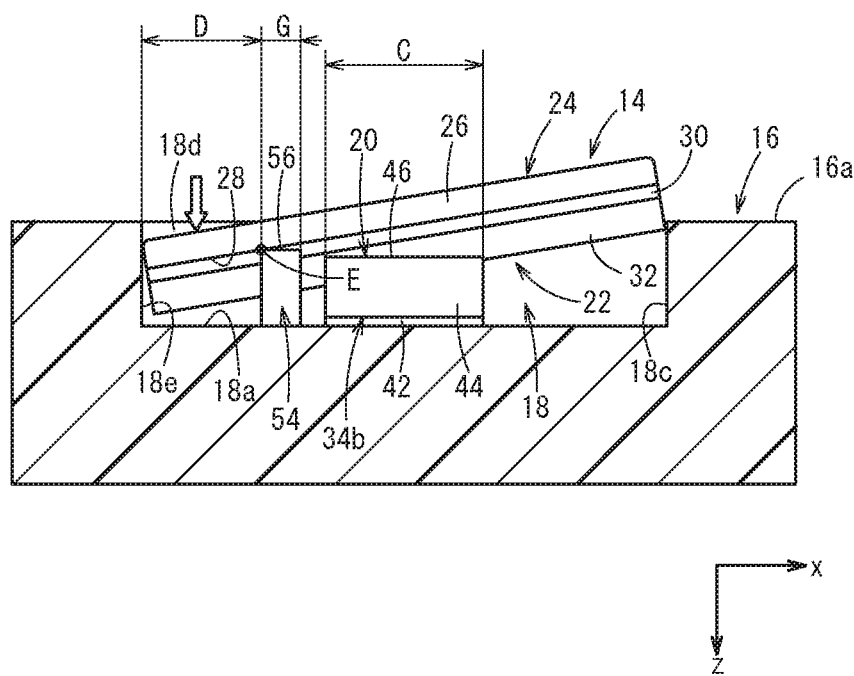
FIG. 12B is a cross-sectional view of the casing showing a state during removal from the casing of the nameplate according to the second embodiment.

FIGS. 12A and 12B are views showing a condition when the nameplate 14 is removed from the casing 16. FIGS. 12A and 12B are cross-sectional views with the casing 16 cut along a surface parallel to the xz plane. FIG. 12A is a perspective cross-sectional view. FIG. 12B is a cross-sectional view as seen from a side in the y-axis negative direction. The casing 16 is illustrated schematically in FIGS. 12A and 12B.

When removing the nameplate 14 from the casing 16, the operator presses the surface 26 of the nameplate 14 in the z-axis positive direction with a fingertip. When the nameplate 14 is viewed from the y-axis direction, the portion to be pressed by the operator is a portion (the region indicated by D in FIG. 12B) within the surface 26 of the nameplate 14, on a side opposite from the portion (the region indicated by C in FIG. 12B) where the projecting part 22 is being gripped by the gripping member 20 of the casing 16, with respect to the portion (the region indicated by G in FIG. 12B) of the back surface 28 that abuts against the abutment 56 of the support member 54.

When the operator presses on the region D of the surface 26 of the nameplate 14, the nameplate 14 is rotated about the abutment 56 of the support member 54 with a part of the abutment 56 acting as the fulcrum E. The fulcrum E is a point on an end in the x-axis negative direction side of the abutment 56. At this time, a force tending to raise the nameplate 14 in the z-axis negative direction acts on the x-axis positive direction side of the nameplate 14.

Consequently, a portion of the projecting part 22 on the x-axis positive direction side separates away from the gripping member 20. When the operator presses the nameplate 14 until a state in which the projecting part 22 abuts against the bottom part 18a, a state is brought about in which the x-axis positive direction side of the main body portion 24 rises up from the surface 16a of the casing 16. The operator can now remove the nameplate 14 from the casing 16 by pinching with the fingers the portion of the main body portion 24 that has risen up from the surface 16a, and pulling the nameplate 14 upward.

[Method of Mounting the Nameplate]

Figure 13A:
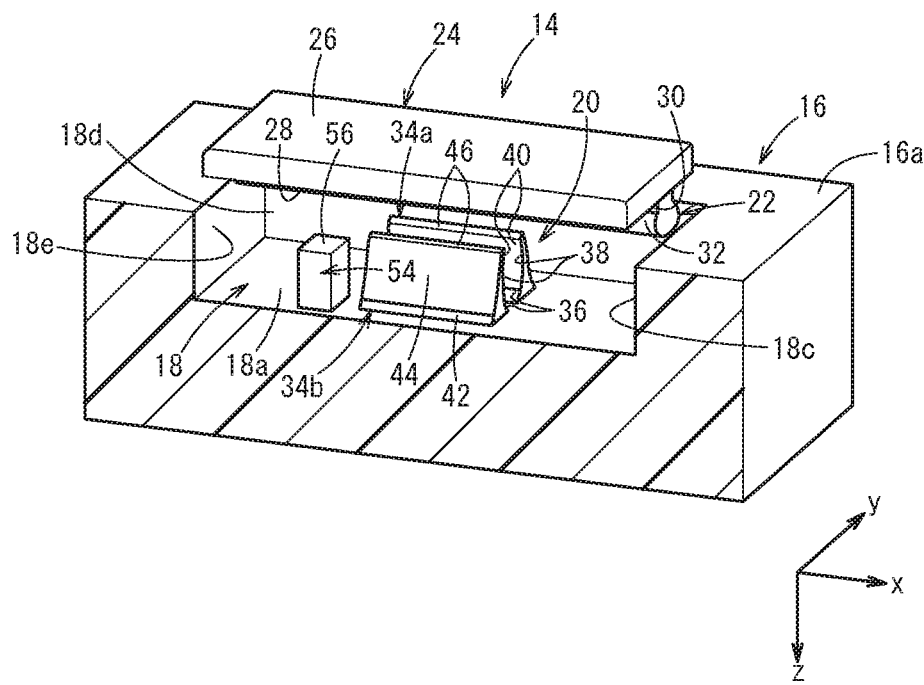
FIG. 13A is a perspective cross-sectional view of a casing showing a state during attachment to the casing of a nameplate according to the second embodiment.
Figure 13B:
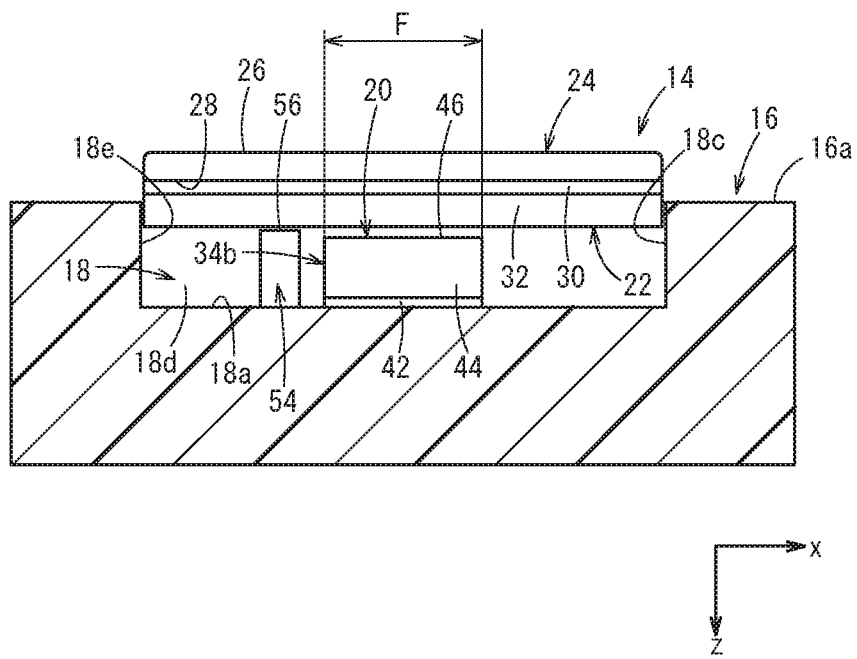
FIG. 13B is a cross-sectional view of the casing showing a state during attachment to the casing of the nameplate according to the second embodiment.

FIGS. 13A and 13B are views showing a condition when the nameplate 14 is mounted on the casing 16. FIGS. 13A and 13B are cross-sectional views with the casing 16 cut along a surface parallel to the xz plane. FIG. 13A is a perspective cross-sectional view. FIG. 13B is a cross-sectional view as seen from a side in the y-axis negative direction. The casing 16 is illustrated schematically in FIGS. 13A and 13B.

When mounting the nameplate 14 on the casing 16, the operator first places the position of the projecting part 22 of the nameplate 14 in the y-axis direction, so as to coincide with the position in the y-axis direction of the gripping member 20, and the nameplate 14 is inserted into the mounting section 18. In a state in which the projecting part 22 is in contact with the distal end parts 46 of the claw members 34a, 34b, the operator presses the surface 26 in the z-axis positive direction with the fingertips. When the nameplate 14 is viewed from the y-axis direction, within the surface 26 of the nameplate 14, the portion that is pressed is a portion where the projecting part 22 is gripped by the gripping member 20 (the region indicated by F in FIG. 13B). At this time, the projecting part 22 pushes the claw members 34a, 34b outwardly. The cylindrical portion 32 passes through the latching sections 40 of the claw members 34a, 34b, and is engaged with the retaining section 38. When the cylindrical portion 32 is engaged with the retaining section 38, the distal end parts 46 abut against the back surface 28 of the main body portion 24. Further, the latching sections 40 and the distal end parts 46 of the claw members 34a, 34b are fitted in engagement between the back surface 28 of the main body portion 24 and the cylindrical portion 32 of the projecting part 22.

[Operations and Effects]

With the mounting structure for the nameplate 14 according to the second embodiment, the fulcrum E is disposed on the abutment 56 of the support member 54 which is formed separately from the gripping member 20. In accordance with this feature, compared to the case of the fulcrum E being provided on the gripping member 20, the position where the fulcrum E is disposed can be chosen freely, and the degree of freedom in design of the mounting section 18 can be increased.

In the mounting structure for a nameplate 14 according to the second embodiment, in a state in which the projecting part 22 of the nameplate 14 is gripped by the gripping member 20, the abutment 56 of the support member 54 that serves as the fulcrum E when removing the nameplate 14 from the casing 16 abuts against the back surface 28 of the main body portion 24. Consequently, when the nameplate 14 is mounted on the casing 16, the main body portion 24 can be supported in a stable manner by the support member 54.

[Third Embodiment]

Next, a mounting structure for a nameplate 14 according to a third embodiment will be described. In the following, a description will be made concerning aspects in which the configuration of the third embodiment differs from the configuration of the first embodiment. Constituent features which are the same as those in the first embodiment are denoted with the same reference numerals, and description of such features is omitted. The configuration of the nameplate 14 in the third embodiment is the same as that of the nameplate 14 of the first embodiment. The third embodiment differs from the first embodiment, in that a plurality of support members 60a to 60d are newly formed on the bottom part 18a of the mounting section 18.

[Configuration of Mounting Section]

Figure 14A:
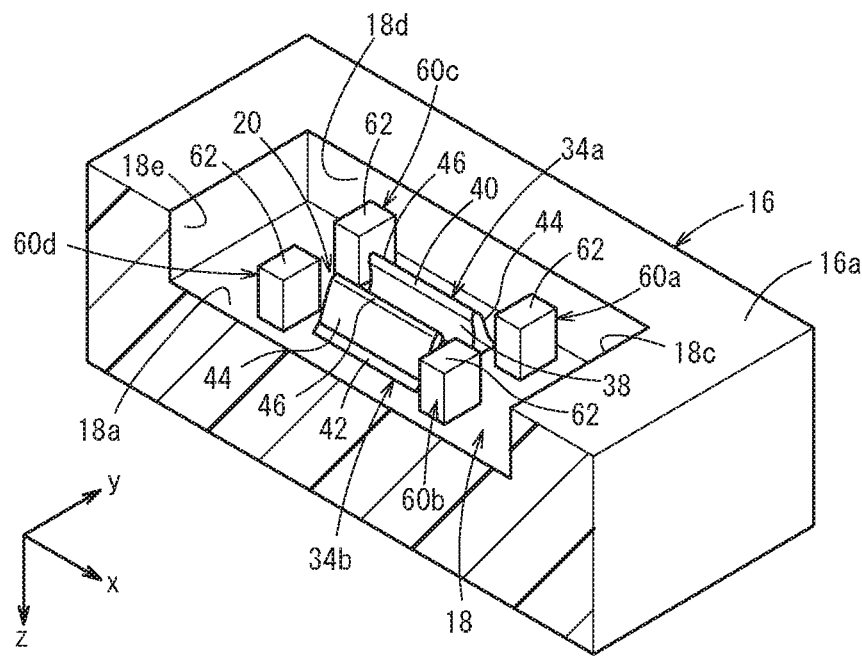
FIG. 14A is a perspective cross-sectional view of a casing in a state in which a nameplate according to a third embodiment is removed therefrom.
Figure 14B:
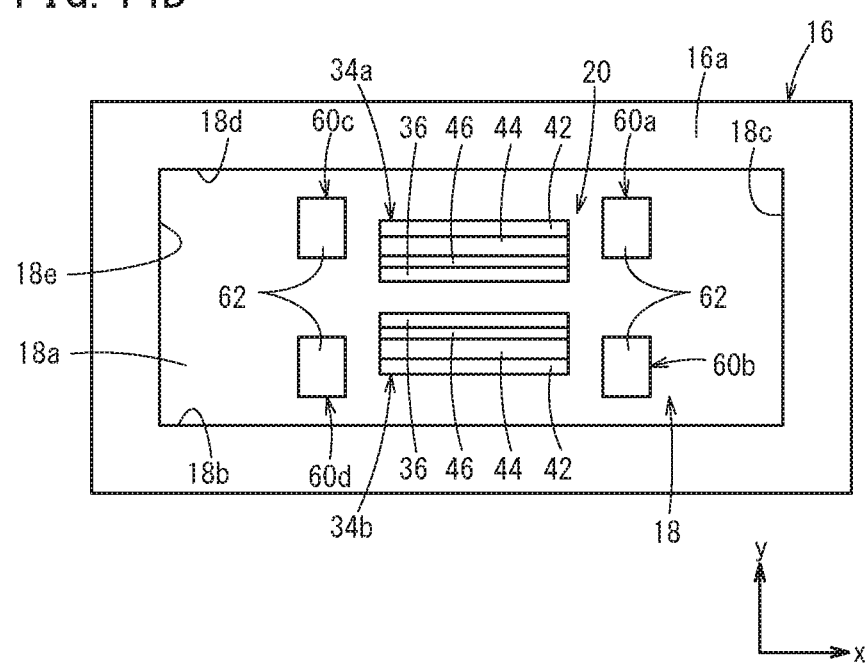
FIG. 14B is a cross-sectional view of the casing in a state in which the nameplate according to the third embodiment is removed therefrom.

FIGS. 14A and 14B are views showing the vicinity of the mounting section 18. FIGS. 14A and 14B show a state in which the nameplate 14 has been removed from the casing 16. FIG. 14A is a perspective cross-sectional view with the casing 16 cut along a surface parallel to the xz plane. FIG. 14B is a view in which the mounting section 18 is seen from a side in the z-axis negative direction. The casing 16 is illustrated schematically in FIGS. 14A and 14B.

Four of the support members 60a to 60d are formed on the bottom part 18a of the mounting section 18. The support member 60a is separated a certain distance away from the claw member 34a toward the x-axis positive direction side, and the support member 60b is separated a certain distance away from the claw member 34b toward the x-axis positive direction side. The support member 60c is separated a certain distance away from the claw member 34a toward the x-axis negative direction side, and the support member 60d is separated a certain distance away from the claw member 34b toward the x-axis negative direction side.

The support member 60a and the support member 60b are disposed in facing relation to each other sandwiching a straight line that passes through the center of the bottom part 18a of the mounting section 18 in the y-axis direction, and lies parallel to the x-axis direction. The distance in the y-axis direction between the support member 60a and the support member 60b is formed to be longer than the width (length) in the y-axis direction of the projecting part 22 of the nameplate 14. The support member 60c and the support member 60d are disposed in facing relation to each other sandwiching a straight line that passes through the center of the bottom part 18a of the mounting section 18 in the y-axis direction, and lies parallel to the x-axis direction. The distance in the y-axis direction between the support member 60c and the support member 60d is formed to be longer than the width (length) in the y-axis direction of the projecting part 22 of the nameplate 14. In accordance with these features, when the nameplate 14 is mounted on the casing 16, the projecting part 22 can be accommodated between the support member 60a and the support member 60b, as well as between the support member 60c and the support member 60d.

The support members 60a to 60d are formed to extend from the bottom part 18a toward a side in the z-axis negative direction. The support members 60a to 60d are formed in substantially rectangular parallelepiped shapes. The support members 60a to 60d each has an abutment 62 formed on a side end thereof in the z-axis negative direction. The abutments 62 have surfaces substantially parallel to the xy plane. The abutments 62 are formed as upper surfaces of the support members 60a to 60d (surfaces on the side of the opening of the mounting section 18). The support members 60a to 60d are made of resin and are molded integrally with the casing 16. The length of the support members 60a to 60d in the z-axis direction is equal to a length in the z-axis direction of the mounting section 18 minus a length (thickness) in the z-axis direction of the main body portion 24 of the nameplate 14. Consequently, when the nameplate 14 is mounted on the casing 16, the back surface 28 of the main body portion 24 comes into contact with the abutments 62 of the support members 60a to 60d. In the third embodiment, each of the abutments 62 corresponds to the fulcrum member of the present invention.

The length of the claw members 34a, 34b in the z-axis direction is formed to be shorter than a length that is obtained by subtracting a length (thickness) in the z-axis direction of the main body portion 24 of the nameplate 14 from a length in the z-axis direction of the mounting section 18. Consequently, when the nameplate 14 is mounted on the casing 16, the back surface 28 of the main body portion 24 does not come into contact with the distal end parts 46 of the claw members 34a, 34b.

[Relationship Between Nameplate and Mounting Section]

Figure 15A:
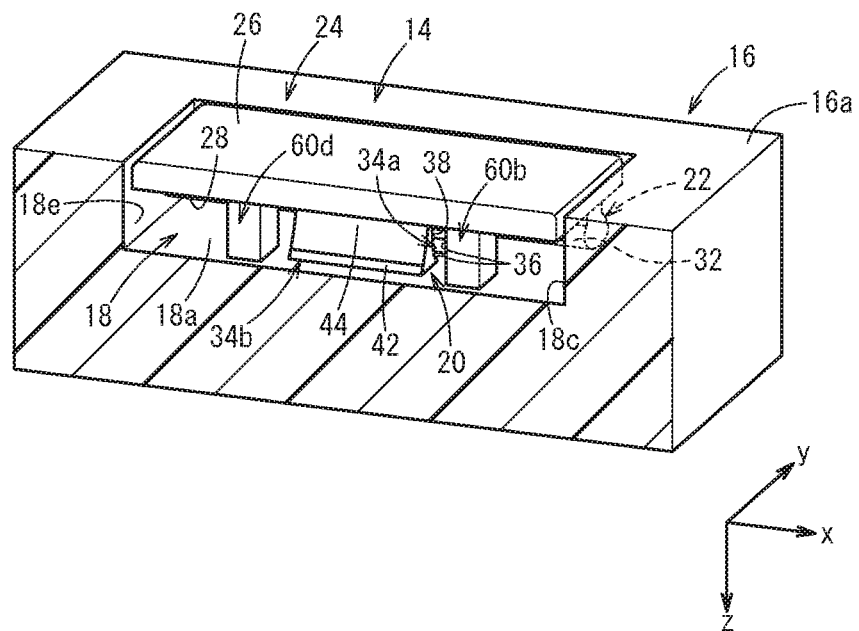
FIG. 15A is a perspective cross-sectional view of the casing in a state in which the nameplate according to the third embodiment is mounted thereon.
Figure 15B:
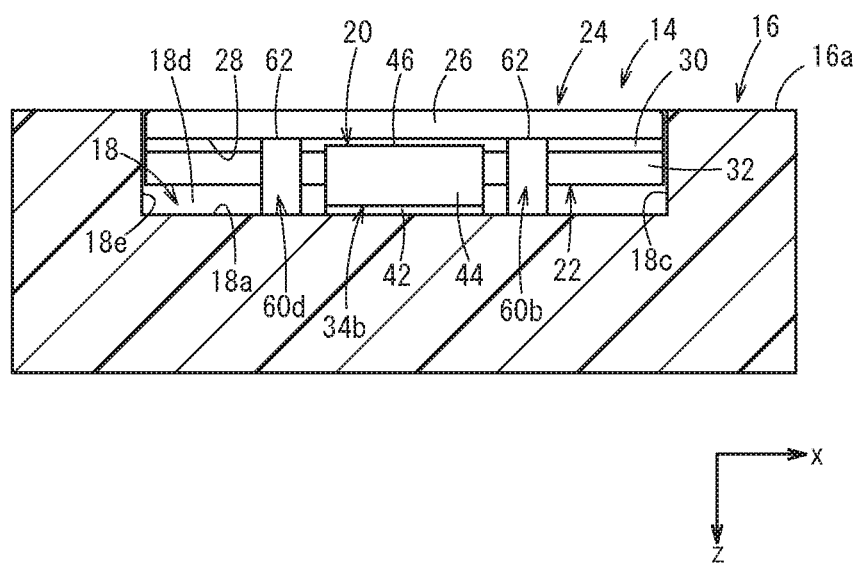
FIG. 15B is a cross-sectional view of the casing in a state in which the nameplate according to the third embodiment is mounted thereon.

FIGS. 15A and 15B are cross-sectional views with the casing 16 cut along a plane parallel to the xz plane, in a state in which the nameplate 14 is mounted on the casing 16. FIG. 15A is a perspective cross-sectional view. FIG. 15B is a cross-sectional view as seen from a side in the y-axis negative direction. The casing 16 is illustrated schematically in FIGS. 15A and 15B. The back surface 28 of the main body portion 24 is separated from the distal end parts 46 of the gripping member 20. On the other hand, the back surface 28 of the main body portion 24 abuts against the abutments 62 of the support members 60a to 60d.

[Method of Removing Nameplate]

Movement of the nameplate 14 at the time that the nameplate 14 is removed from the casing 16 is substantially the same as in the second embodiment. However, unlike the support member 54 of the second embodiment, the support members 60a to 60d of the third embodiment are provided on both sides in the x-axis direction with respect to the gripping member 20. Therefore, within the surface 26 of the nameplate 14, an operator can remove the nameplate 14 by pressing either of both sides of the nameplate 14 in the x-axis direction with respect to the gripping member 20.

Within the surface 26, when the operator presses a side located more on the x-axis positive direction side (the x-axis positive direction side with respect to the gripping member 20) than the support member 60a and the support member 60b, the nameplate 14 is rotated about the abutment 62 of the support member 60a and the abutment 62 of the support member 60b with points in the x-axis positive direction side thereof acting as a fulcrum. When the operator presses a side located more on the x-axis negative direction side (the x-axis negative direction side with respect to the gripping member 20) of the surface 26 than the support member 60c and the support member 60d, the nameplate 14 is rotated about the abutment 62 of the support member 60c and the abutment 62 of the support member 60d with points in the x-axis negative direction side thereof acting as a fulcrum.

[Operations and Effects]

With the mounting structure for the nameplate 14 according to the third embodiment, the support members 60a to 60d are formed on both sides sandwiching the gripping member 20 therebetween. Consequently, no matter which region of the surface is pressed on either of both sides of the surface 26 of the nameplate 14 sandwiching the gripping member 20 therebetween, the nameplate 14 can be detached from the casing 16. Thus, ease of operation can be enhanced. Further, it is possible to support the main body portion 24 by the abutments 62 of the support members 60a to 60d on both sides sandwiching the gripping member 20 therebetween. In accordance with this feature, it is possible to prevent the nameplate 14 from becoming inclined with respect to the casing 16, and the nameplate 14 can be supported in a stable manner.

Other Embodiments

The present invention is not limited to the above-described embodiments, and may be freely modified without departing from the essence and gist of the present invention.

Other Embodiment 1

Figure 16A:
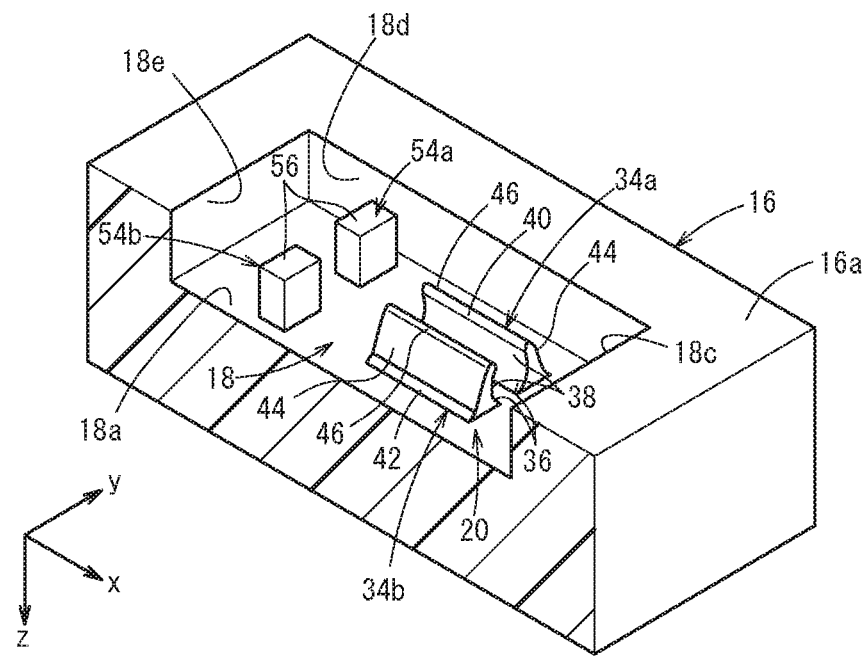
FIG. 16A is a perspective cross-sectional view of a casing in a state in which a nameplate according to another Embodiment 1 is removed therefrom.
Figure 16B:
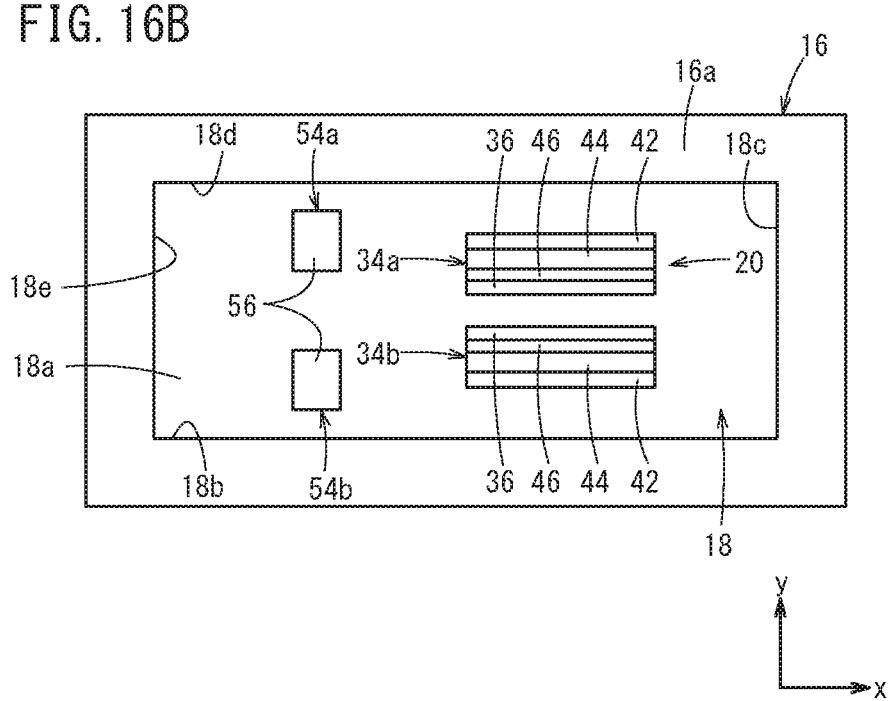
FIG. 16B is a view showing the vicinity of a mounting section in a state in which the nameplate according to the other Embodiment 1 is removed therefrom.

FIGS. 16A and 16B are views showing the vicinity of the mounting section 18. FIGS. 16A and 16B show a state in which the nameplate 14 has been removed from the casing 16. FIG. 16A is a perspective cross-sectional view with the casing 16 cut along a surface parallel to the xz plane. FIG. 16B is a view in which the mounting section 18 is seen from a side in the z-axis negative direction. The casing 16 is illustrated schematically in FIGS. 16A and 16B.

According to the second embodiment, one support member 54 is formed on the x-axis negative direction side of the gripping member 20 (see FIGS. 10A and 10B). This configuration may be modified by forming the support members 54 in plurality. For example, as shown in FIGS. 16A and 16B, two support members 54 may be formed on the bottom part 18a of the mounting section 18. The support member 54a is separated a certain distance away from the claw member 34a toward the x-axis negative direction side, and the support member 54b is separated a certain distance away from the claw member 34b toward the x-axis negative direction side. By providing the plurality of support members 54, it is possible to more stably support the nameplate 14 when the nameplate 14 is rotated, as compared with a case in which the nameplate 14 is supported by only one support member 54. Further, by providing the plurality of support members 54, as compared with the case in which the nameplate 14 is supported by only one support member 54, it is possible to more stably support the nameplate 14, even when the nameplate 14 is mounted on the casing 16.

Further, according to the second embodiment, the gripping member 20 is formed in the vicinity of the center of the bottom part 18a. As a modification to this configuration, as shown in FIGS. 16A and 16B, the gripping member 20 may be formed more closely to the x-axis positive direction side with respect to the central portion of the bottom part 18a. In the Other Embodiment 1, the support members 54a, 54b are formed on the x-axis negative direction side with respect to the gripping member 20. By forming the gripping member 20 more closely to the x-axis positive direction side with respect to the central portion of the bottom part 18a, it is possible to increase the distance between the support members 54a, 54b and the gripping member 20. Therefore, it is possible to support the nameplate 14 in a stable manner.

[Other Embodiment 2]

Figure 17A:
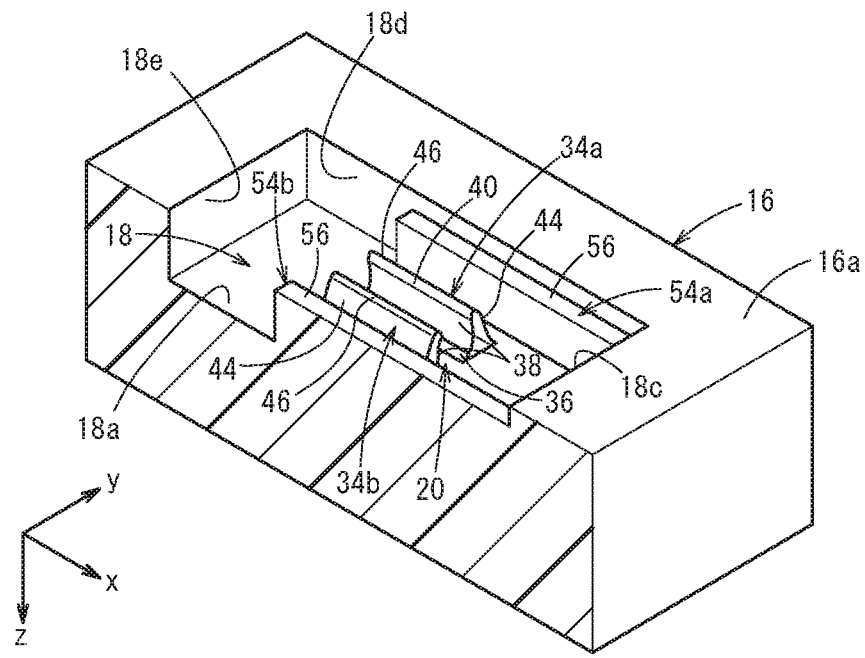
FIG. 17A is a perspective cross-sectional view of a casing in a state in which a nameplate according to another Embodiment 2 is removed therefrom.
Figure 17B:
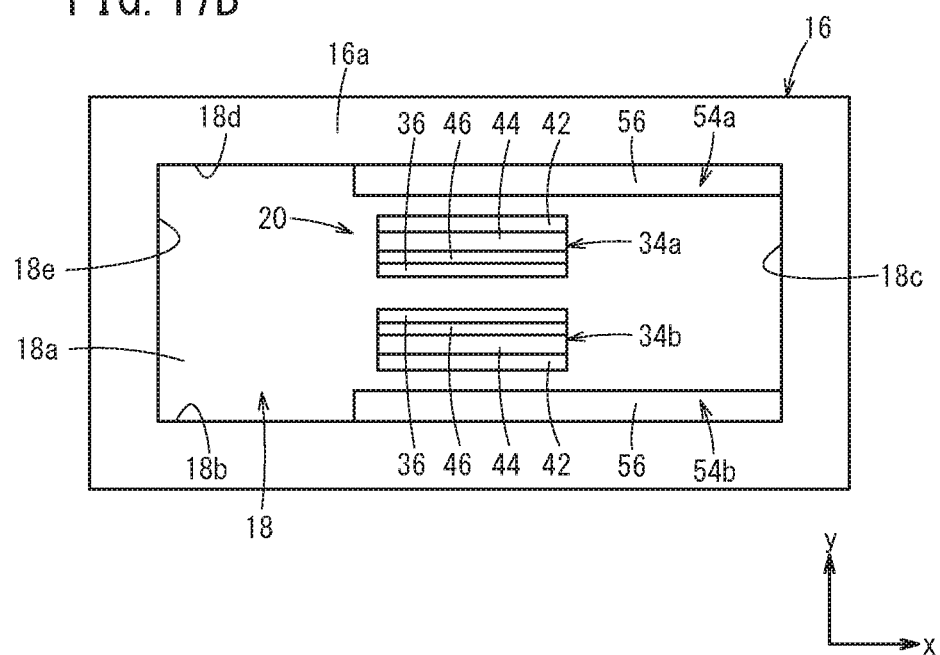
FIG. 17B is a view showing the vicinity of a mounting section in a state in which the nameplate according to the other Embodiment 2 is removed therefrom.

FIGS. 17A and 17B are views showing the vicinity of the mounting section 18. FIGS. 17A and 17B show a state in which the nameplate 14 has been removed from the casing 16. FIG. 17A is a perspective cross-sectional view with the casing 16 cut along a surface parallel to the xz plane. FIG. 17B is a view in which the mounting section 18 is seen from a side in the z-axis negative direction. The casing 16 is illustrated schematically in FIGS. 17A and 17B.

According to the second embodiment, the support member 54 is formed only on the x-axis negative direction side of the gripping member 20. As a modification to this configuration, the support member 54 may also be formed on the x-axis positive direction side of the gripping member 20. For example, as shown in FIGS. 17A and 17B, a support member 54a and a support member 54b may be formed from the x-axis negative direction side to the x-axis positive direction side of the gripping member 20. The y-axis positive direction side of the support member 54a is connected to the side surface 18d. The y-axis negative direction side of the support member 54b is connected to the side surface 18b. Side end portions in the x-axis negative direction of the support member 54a and the support member 54b are located more closely to the x-axis negative direction side than the x-axis negative direction side end portion of the gripping member 20, but are separated from the side surface 18d. The side end portions in the x-axis positive direction of the support member 54a and the support member 54b are connected to the side surface 18c.

According to the Other Embodiment 2, since the support member 54a and the support member 54b are formed separately from each other in the y-axis direction, it is possible to suppress inclination of the main body portion 24 of the nameplate 14 in the y-axis direction, and thus the nameplate 14 can be stably supported. Further, according to the Other Embodiment 2, since the support member 54a and the support member 54b extend along the x-axis direction, it is possible to suppress inclination of the main body portion 24 of the nameplate 14 in the x-axis direction, and thus the nameplate 14 can be stably supported. Further, with the Other Embodiment 2, the x-axis negative direction sides of the support member 54a and the support member 54b are separated from the side surface 18e. Consequently, a space in which the nameplate 14 is rotated can be assured within the mounting section 18.

[Other Embodiment 3]

Figure 18A:
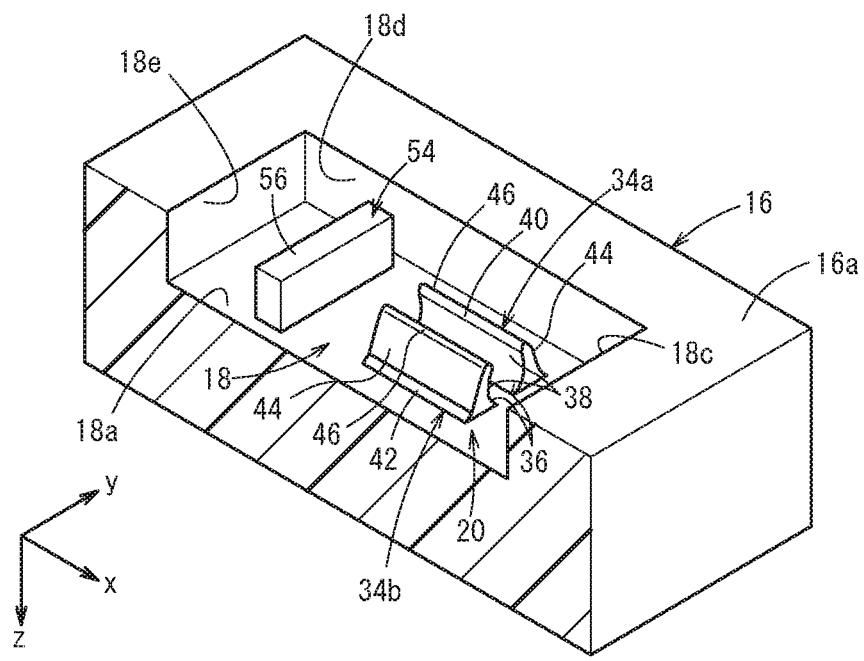
FIG. 18A is a perspective cross-sectional view of a casing in a state in which a nameplate according to another Embodiment 3 is removed therefrom.
Figure 18B:
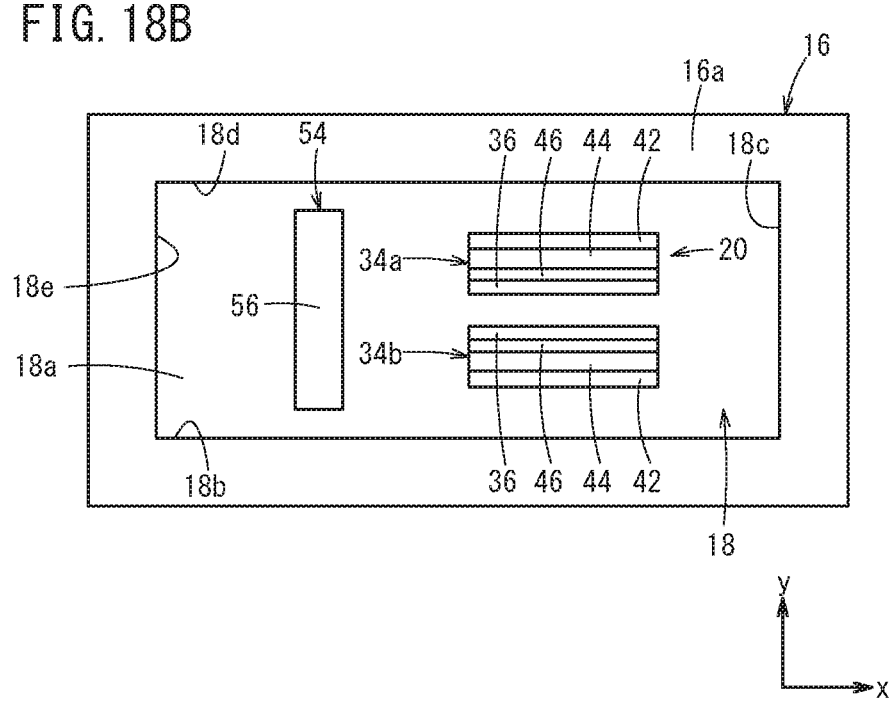
FIG. 18B is a view showing the vicinity of a mounting section in a state in which the nameplate according to the other Embodiment 3 is removed therefrom.

FIGS. 18A and 18B are views showing the vicinity of the mounting section 18. FIGS. 18A and 18B show a state in which the nameplate 14 has been removed from the casing 16. FIG. 18A is a perspective cross-sectional view with the casing 16 cut along a surface parallel to the xz plane. FIG. 18B is a view in which the mounting section 18 is seen from a side in the z-axis negative direction. The casing 16 is illustrated schematically in FIGS. 18A and 18B.

According to the second embodiment, one support member 54 is disposed only on the x-axis negative direction side of the claw member 34b (see FIGS. 10A and 10B). As a modification to this configuration, the support member 54 may also be formed on the x-axis negative direction side of the claw member 34a. For example, as shown in FIGS. 18A and 18B, the support member 54 may be formed so as to extend in the y-axis direction straddling across the center in the y-axis direction of the bottom part 18a. The support member 54 is formed on the x-axis negative direction side at a certain distance from the claw member 34a and the claw member 34b.

According to the Other Embodiment 3, since the support member 54 is formed so as to extend in the y-axis direction, it is possible to suppress inclination of the nameplate 14 in the y-axis direction. Therefore, it is possible to support the nameplate 14 in a stable manner.

Figure 19:
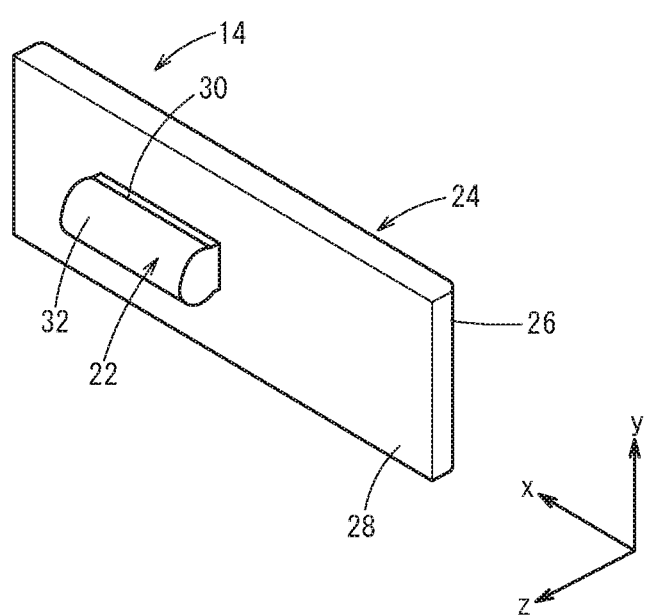
FIG. 19 is a perspective view of the nameplate according to the other Embodiment 3.

Moreover, according to the Other Embodiment 3, the shape of the projecting part 22 of the nameplate 14 differs from that of the first to third embodiments. FIG. 19 is a perspective view of the nameplate 14. According to the first through third embodiments, the projecting part 22 is formed over an entire region from an end in the positive direction to an end in the negative direction in the x-axis direction of the back surface 28 (see FIG. 3B). As a modification to this configuration, the projecting part 22 may be formed in the x-axis direction on a portion of the back surface 28. For example, as shown in FIG. 19, the projecting part 22 may be formed more closely to the x-axis positive direction side with respect to a central portion of the back surface 28 in the x-axis direction.

According to the Other Embodiment 3, the support member 54 is formed so as to straddle across the center in the y-axis direction of the bottom part 18a. Since the projecting part 22 is formed in the x-axis direction on a portion of the back surface 28, interference between the projecting part 22 and the support member 54 can be avoided.

[Other Embodiment 4]

Figure 20A:
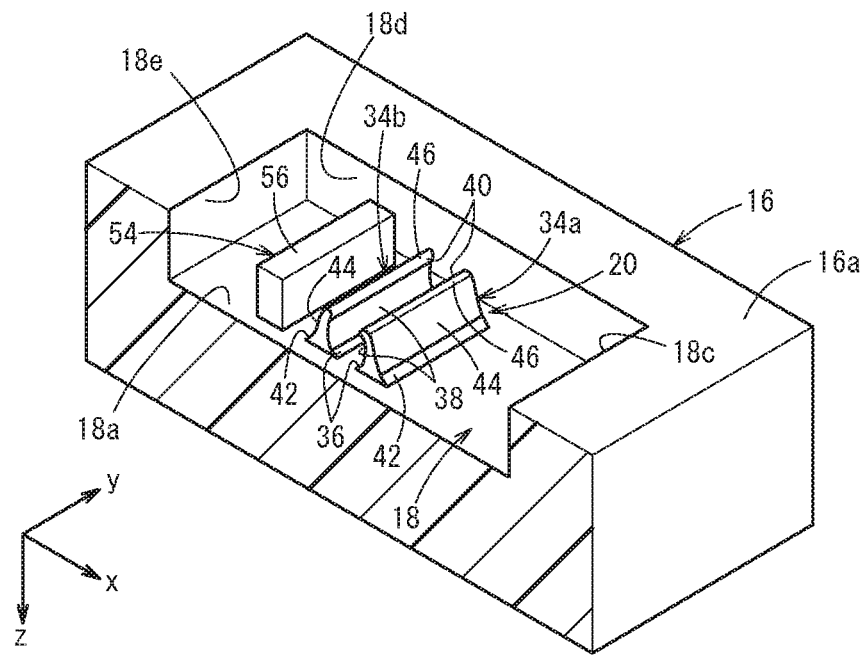
FIG. 20A is a perspective cross-sectional view of a casing in a state in which a nameplate according to another Embodiment 4 is removed therefrom.
Figure 20B:
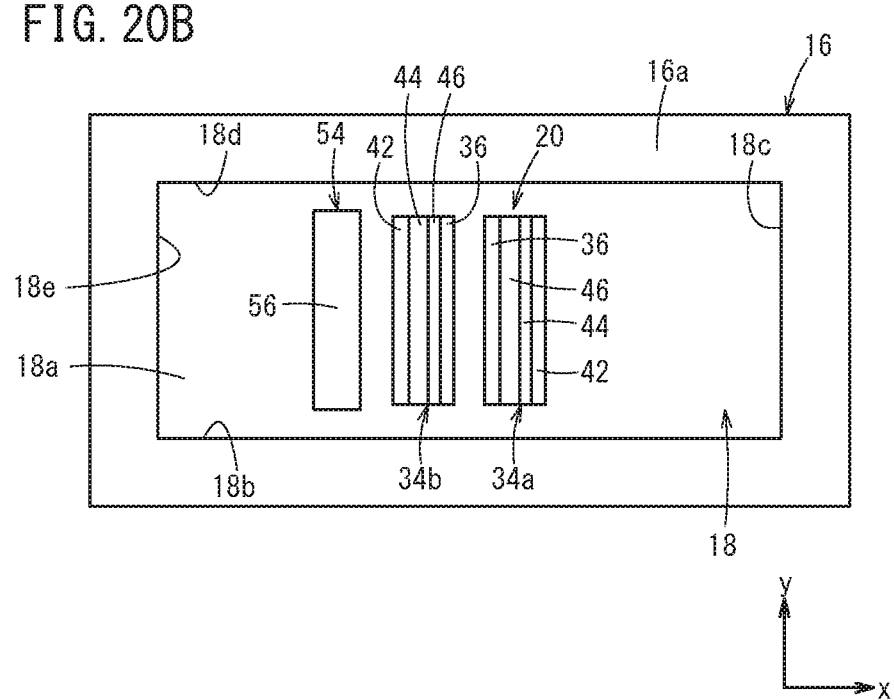
FIG. 20B is a view showing the vicinity of a mounting section in a state in which the nameplate according to the other Embodiment 4 is removed therefrom.

FIGS. 20A and 20B are views showing the vicinity of the mounting section 18. FIGS. 20A and 20B show a state in which the nameplate 14 has been removed from the casing 16. FIG. 20A is a perspective cross-sectional view with the casing 16 cut along a surface parallel to the xz plane. FIG. 20B is a view in which the mounting section 18 is seen from a side in the z-axis negative direction. The casing 16 is illustrated schematically in FIGS. 20A and 20B.

In the first through third embodiments, the claw member 34a and the claw member 34b of the gripping member 20 are disposed in facing relation to each other sandwiching a straight line that passes through the center of the bottom part 18a of the mounting section 18 in the y-axis direction, and lies parallel to the x-axis direction (see FIG. 4). As a modification to this configuration, as shown in FIGS. 20A and 20B, the claw member 34a and the claw member 34b may be disposed in facing relation to each other sandwiching a straight line that passes through the center of the bottom part 18a of the mounting section 18 in the x-axis direction, and lies parallel to the y-axis direction.

Moreover, according to the Other Embodiment 4, the shape of the projecting part 22 of the nameplate 14 differs from that of the first to third embodiments. FIG. 21 is a perspective view of the nameplate 14. According to the first through third embodiments, the projecting part 22 is formed to extend in the x-axis direction at a central portion in the y-axis direction of the back surface 28 (see FIG. 3B). As a modification to this configuration, as shown in FIG. 21, the projecting part 22 may be formed to extend in the y-axis direction at a central portion in the x-axis direction of the back surface 28. Consequently, as shown in FIGS. 20A and 20B, the nameplate 14 can be mounted on the casing 16, which is formed by disposing the claw member 34a and the claw member 34b in facing relation to each other sandwiching a straight line in the y-axis direction.

[Other Embodiment 5]

Figure 22A:
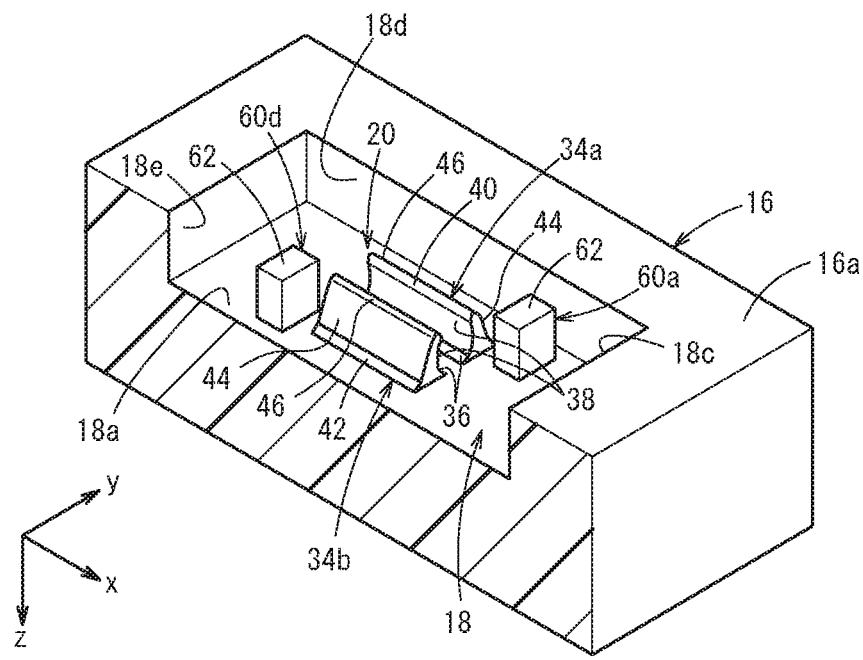
FIG. 22A is a perspective cross-sectional view of a casing in a state in which a nameplate according to another Embodiment 5 is removed therefrom.
Figure 22B:
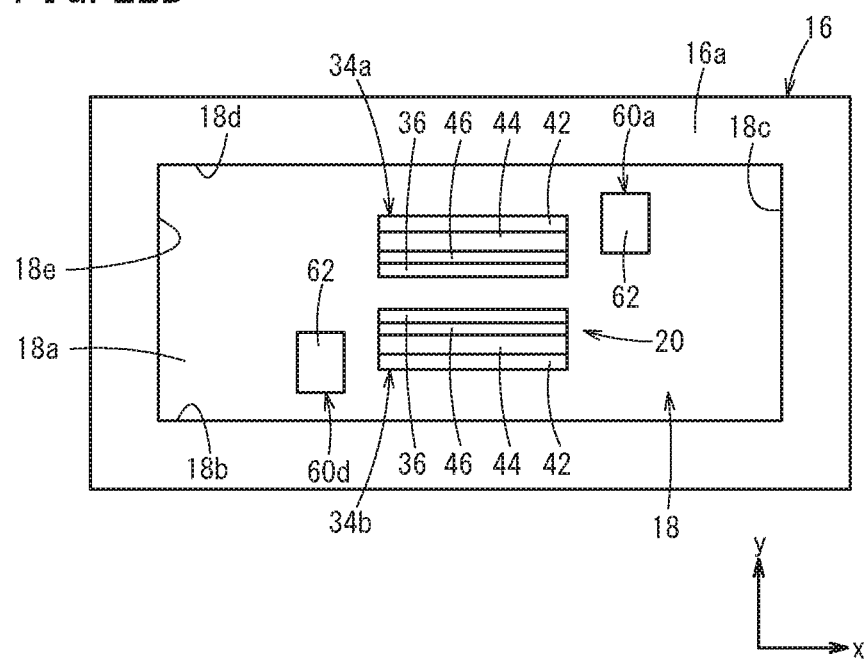
FIG. 22B is a view showing the vicinity of a mounting section in a state in which the nameplate according to the other Embodiment 5 is removed therefrom.

FIGS. 22A and 22B are views showing the vicinity of the mounting section 18. FIGS. 22A and 22B show a state in which the nameplate 14 has been removed from the casing 16. FIG. 22A is a perspective cross-sectional view with the casing 16 cut along a surface parallel to the xz plane. FIG. 22B is a view in which the mounting section 18 is seen from a side in the z-axis negative direction. The casing 16 is illustrated schematically in FIGS. 22A and 22B.

In the third embodiment, four of the support members 60a to 60d are formed. As a modification to this configuration, for example, as shown in FIGS. 22A and 22B, two support members 60a, 60d may be formed. The support member 60a is separated a certain distance away from the claw member 34a toward the x-axis positive direction side, and the support member 60d is separated a certain distance away from the claw member 34b toward the x-axis negative direction side.

By reducing the number of the support members 60a to 60d, it is possible to simplify the shape of the mold that is used for molding the casing 16. Further, since the support member 60a and the support member 60d are placed in contact with the back surface 28 of the nameplate 14, and on a diagonal line of the back surface 28, the nameplate 14 can be supported in a stable manner.

[Other Embodiment 6]

Figure 23A:
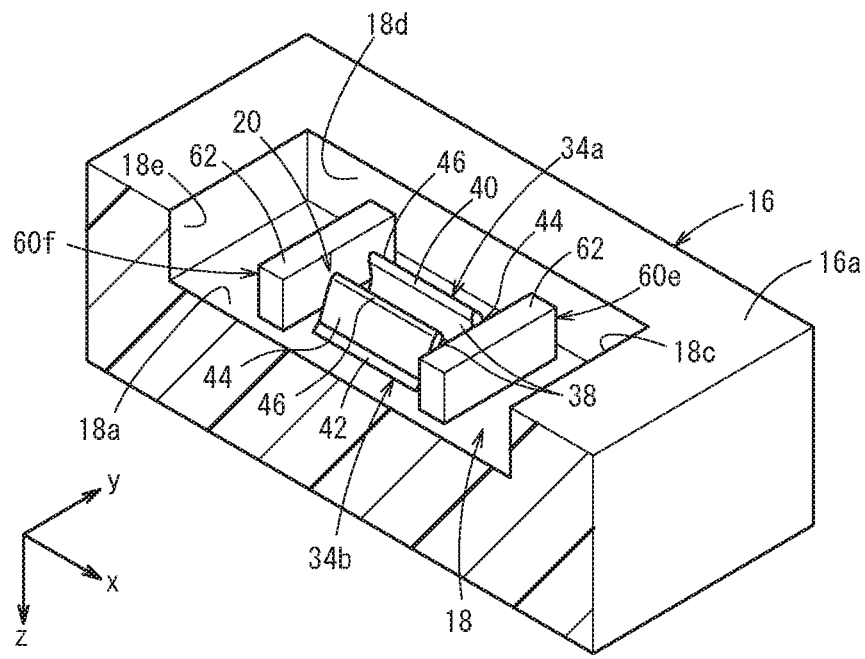
FIG. 23A is a perspective cross-sectional view of a casing in a state in which a nameplate according to another Embodiment 6 is removed therefrom.
Figure 23B:
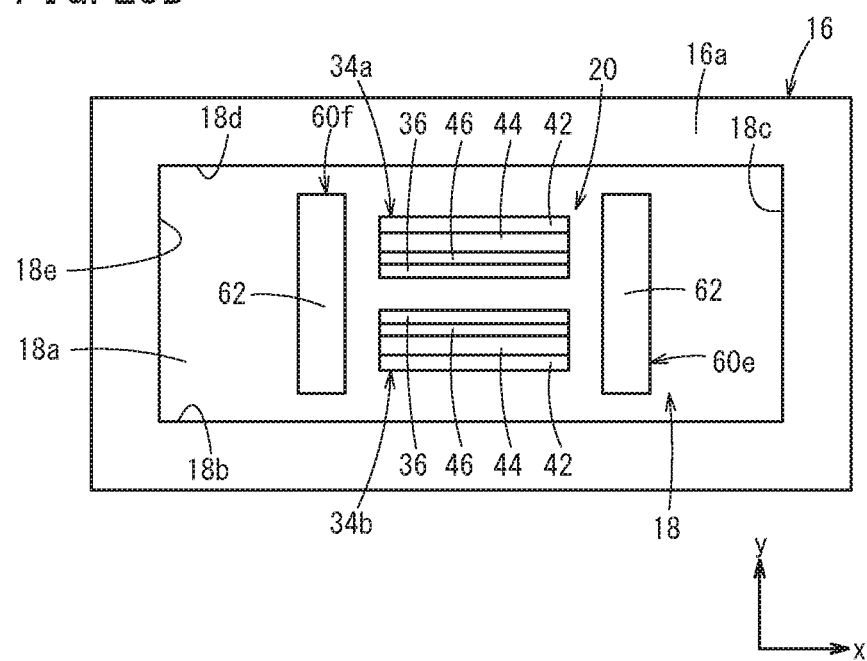
FIG. 23B is a view showing the vicinity of a mounting section in a state in which the nameplate according to the other Embodiment 6 is removed therefrom.

FIGS. 23A and 23B are views showing the vicinity of the mounting section 18. FIGS. 23A and 23B show a state in which the nameplate 14 has been removed from the casing 16. FIG. 23A is a perspective cross-sectional view with the casing 16 cut along a surface parallel to the xz plane. FIG. 23B is a view in which the mounting section 18 is seen from a side in the z-axis negative direction. The casing 16 is illustrated schematically in FIGS. 23A and 23B.

According to the third embodiment, the support member 60a and the support member 60b are formed on the x-axis positive direction side with respect to the gripping member 20 while being separated from each other in the y-axis direction, and the support member 60c and the support member 60d are formed on the x-axis negative direction side with respect to the gripping member 20 while being separated from each other in the y-axis direction (see FIGS. 14A and 14B). As a modification to this configuration, for example, as shown in FIGS. 23A and 23B, the support member 60a and the support member 60b may be formed together integrally to make up a support member 60e, and the support member 60c and the support member 60d may be formed together integrally to make up a support member 60f.

According to the Other Embodiment 6, the support member 60e and the support member 60f can be formed with a larger volume than the support members 60a to 60d of the third embodiment. Owing thereto, the structure of the mold used for molding the casing 16 can be simplified, and the mold can easily be removed.

Figure 24:
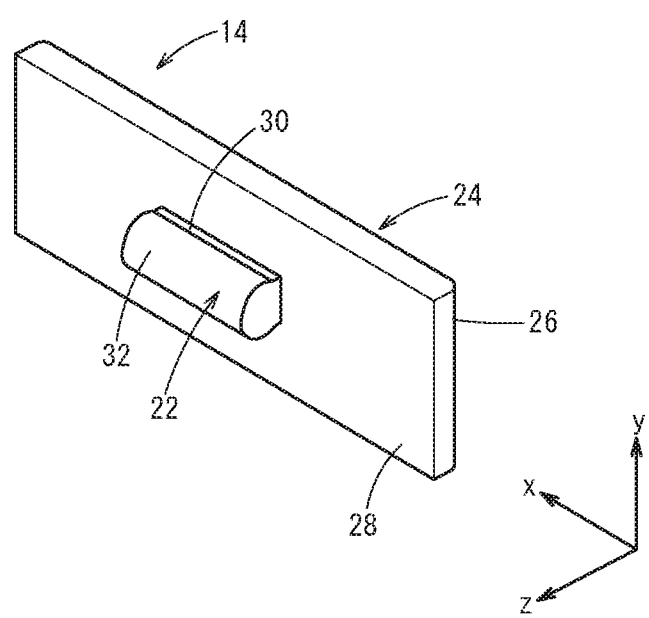
FIG. 24 is a perspective view of the nameplate according to the other Embodiment 6.

Moreover, according to the Other Embodiment 6, the shape of the projecting part 22 of the nameplate 14 differs from that of the first to third embodiments. FIG. 24 is a perspective view of the nameplate 14. According to the first through third embodiments, the projecting part 22 is formed over an entire region from an end in the positive direction to an end in the negative direction in the x-axis direction of the back surface 28 (see FIG. 3B). As a modification to this configuration, the projecting part 22 may be formed in the x-axis direction on a portion of the back surface 28. For example, as shown in FIG. 24, the projecting part 22 may be formed only in the vicinity of a central portion in the x-axis direction of the back surface 28.

According to the Other Embodiment 6, the support member 60e and the support member 60f are formed so as to straddle across the center in the y-axis direction of the bottom part 18a. Since the projecting part 22 is formed in the x-axis direction on a portion of the back surface 28, interference between the projecting part 22 and the support member 54 can be avoided.

[Other Seventh Embodiment]

Figure 25:
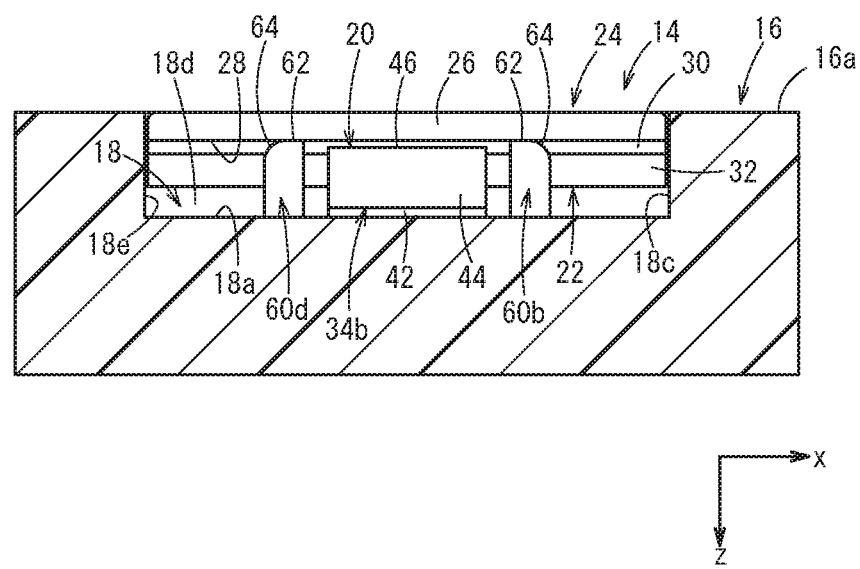
FIG. 25 is a cross-sectional view of a casing showing a state in which a nameplate according to another Embodiment 7 is attached to the casing.

FIG. 25 is a cross-sectional view with the casing 16 cut along a plane parallel to the xz plane, in a state in which the nameplate 14 is mounted on the casing 16. FIG. 25 is a cross-sectional view as seen from a side in the y-axis negative direction.

According to the third embodiment, the support members 60a to 60d include the abutments 62, which are defined by planes that are substantially parallel to the xy plane. As shown in FIG. 25, this configuration may be modified such that rounded portions 64 are provided adjacent to the abutments 62. On the support member 60a and the support member 60b, the rounded portions 64 are formed adjacent to the abutments 62 on the x-axis positive direction side. On the support member 60c and the support member 60d, the rounded portions 64 are formed adjacent to the abutments 62 on the x-axis negative direction side. When the support members 60a and 60b are viewed from the y-axis direction, the rounded portions 64 are formed as curved surfaces forming connections in an arcuate shape between the abutments 62 and side surfaces on the x-axis positive direction side. When the support members 60c and 60d are viewed from the y-axis direction, the rounded portions 64 are formed as curved surfaces forming connections in an arcuate shape between the abutments 62 and side surfaces on the x-axis negative direction side. Owing to this feature, when the nameplate 14 is removed from the casing 16, it becomes easier to rotate the nameplate 14 on the support members 60a to 60d.

[Other Aspects]

In the first to third embodiments, when the nameplate 14 is removed from the casing 16, portions of the claw members 34a, 34b, the support member 54, or the support member 60 in contact with the back surface 28 of the nameplate 14 act as the fulcrum E, so as to allow the nameplate 14 to be rotated. Instead of this configuration, a portion in contact with the projecting part 22 of the nameplate 14 may be provided on the side of the mounting section 18, and the nameplate 14 may be rotated about such a portion, which acts as the fulcrum E in contact with the projecting part 22.

In the second embodiment or the third embodiment, the support member 54 or the support member 60 is formed to extend in the z-axis negative direction from the bottom part 18a of the mounting section 18. Instead of this configuration, the support members 54, 60 may be formed to extend in the x-axis direction from the side surface 18b or the side surface 18d. In this case, the support members 54, 60 need not be connected to the bottom part 18a.

What is claimed is:

1. A structure, comprising:
   a casing; and
   a nameplate mounted detachably on the casing,
   the nameplate comprising:
      a main body portion formed in a plate-like shape; and
      a projecting part formed to project out from a surface of the main body portion;
   the casing comprising:
      a recessed portion in which the nameplate is mounted;
      a gripping member formed on a bottom part of the recessed portion, and which grips the projecting part; and
      a fulcrum member in contact with a portion of the nameplate that faces toward the bottom part side of the recessed portion, and which acts as a fulcrum when the nameplate is rotated;
   wherein the recessed portion includes a space formed between the nameplate and the bottom part of the recessed portion, the space enabling the nameplate to be rotated about the fulcrum that serves as a center of rotation, in a state with the nameplate being mounted on the casing.

2. The structure according to claim 1, wherein the fulcrum member is disposed on the gripping member.

3. The structure according to claim 2, wherein:
   an upper surface of the gripping member contacts the main body portion, in a state in which the gripping member grips the projecting part; and
   a portion of the upper surface of the gripping member functions as the fulcrum.

4. The structure according to claim 1, wherein the fulcrum member is disposed on a support member separately from the gripping member.

5. The structure according to claim 4, wherein:
   an upper surface of the support member contacts the main body portion, in a state in which the gripping member grips the projecting part; and
   a portion of the upper surface of the support member functions as the fulcrum member.

6. The structure according to claim 4, wherein fulcrum members are formed on opposite sides sandwiching the gripping member therebetween.

7. The structure according to claim 1, wherein:
   the projecting part is formed in a substantially cylindrical shape extending in parallel to the surface of the main body portion on which the projecting part is disposed; and mutually opposing surfaces of portions of the gripping member and which sandwich the projecting part therebetween are formed in substantially arcuate shapes.

* * * * *